(12) United States Patent
Talty et al.

(10) Patent No.: US 9,698,845 B2
(45) Date of Patent: *Jul. 4, 2017

(54) HIGH OVERSAMPLING RATIO DYNAMIC ELEMENT MATCHING SCHEME FOR HIGH DYNAMIC RANGE DIGITAL TO RF DATA CONVERSION FOR RADIO COMMUNICATION SYSTEMS

(71) Applicant: GM GLOBAL TECHNOLOGY OPERATIONS LLC, Detroit, MI (US)

(72) Inventors: Timothy J. Talty, Beverly Hills, MI (US); Cynthia D. Baringer, Malibu, CA (US); Mohiuddin Ahmed, Moorpark, CA (US); Albert E. Cosand, Agoura Hills, CA (US); James Chingwei Li, Simi Valley, CA (US); Peter Petre, Oak Park, CA (US); Zhiwei A. Xu, Davis, CA (US); Yen-Cheng Kuan, Los Angeles, CA (US)

(73) Assignee: GM Global Technology Operations LLC, Detroit, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 15/103,298

(22) PCT Filed: Nov. 6, 2015

(86) PCT No.: PCT/US2015/059588
§ 371 (c)(1),
(2) Date: Jun. 9, 2016

(87) PCT Pub. No.: WO2016/073930
PCT Pub. Date: May 12, 2016

(65) Prior Publication Data
US 2016/0315648 A1 Oct. 27, 2016

Related U.S. Application Data

(60) Provisional application No. 62/076,363, filed on Nov. 6, 2014.

(51) Int. Cl.
| | | |
|---|---|---|
| H03M 3/00 | (2006.01) | |
| H04B 1/3822 | (2015.01) | |
| H03M 13/27 | (2006.01) | |
| H04L 25/02 | (2006.01) | |
| H04B 1/04 | (2006.01) | |
| H04L 1/00 | (2006.01) | |

(52) U.S. Cl.
CPC .......... *H04B 1/3822* (2013.01); *H03M 3/338* (2013.01); *H03M 13/27* (2013.01);
(Continued)

(58) Field of Classification Search
CPC ........ H03M 3/30; H03M 3/326; H03M 3/338; H03M 3/408; H03M 3/458; H03M 3/50;
(Continued)

(56) References Cited

U.S. PATENT DOCUMENTS 7,298,308 B1 11/2007 Rueger et al.
7,912,499 B2 3/2011 Ouzillou
(Continued)

*Primary Examiner* — Duc M Nguyen
(74) *Attorney, Agent, or Firm* — John A. Miller; Miller IP Group, PLC

(57) ABSTRACT

An RF transmitter module for a cellular radio that includes a delta-sigma modulator having a plurality of interleaving dynamic element matching (DEM) circuits providing interleaved digital bits at a reduced clock rate. An interleaver controller controls the DEM circuits so as to provide groups of the digital bits at different points in time. In one embodiment, a summation junction adds the groups of the digital bits to provide a continuous stream of the interleaved digital bits, a DAC converts the stream of interleaved digital bits to an analog signal, and a power amplifier amplifies the analog signal.

20 Claims, 17 Drawing Sheets

(52) U.S. Cl.
CPC ............ *H04B 1/04* (2013.01); *H04L 1/0071* (2013.01); *H04L 25/02* (2013.01); *H03M 3/408* (2013.01); *H03M 3/458* (2013.01); *H03M 3/502* (2013.01); *H04B 2001/0408* (2013.01)

(58) Field of Classification Search
CPC ... H03M 3/502; H04B 1/0007; H04B 1/0028; H04B 14/06
USPC .......................................... 341/77, 143, 126
See application file for complete search history.

(56) References Cited

U.S. PATENT DOCUMENTS

| | | | |
|---|---|---|---|
| 9,537,514 B2 * | 1/2017 | Talty | .................. H04B 1/0003 |
| 2006/0057983 A1 | 3/2006 | Thompson et al. | |
| 2006/0109153 A1 | 5/2006 | Gupta | |
| 2006/0245517 A1 | 11/2006 | Ikedo et al. | |
| 2008/0212653 A1 | 9/2008 | Kurashima et al. | |
| 2008/0310479 A1 * | 12/2008 | Koslar | .................. H04B 1/692 375/131 |
| 2009/0088124 A1 | 4/2009 | Schuur et al. | |
| 2010/0166124 A1 | 7/2010 | Behrens et al. | |
| 2010/0183093 A1 | 7/2010 | Ghannouchi et al. | |
| 2011/0148679 A1 | 6/2011 | Karthaus et al. | |
| 2011/0163909 A1 | 7/2011 | Jeong | |
| 2011/0200077 A1 | 8/2011 | Mitani et al. | |
| 2013/0194114 A1 | 8/2013 | Ritter et al. | |
| 2014/0087671 A1 | 3/2014 | Mostov et al. | |
| 2015/0373643 A1 * | 12/2015 | Talty | ................. H04W 52/0209 370/311 |
| 2016/0020781 A1 * | 1/2016 | Baringer | ................. H03M 3/47 341/110 |

\* cited by examiner

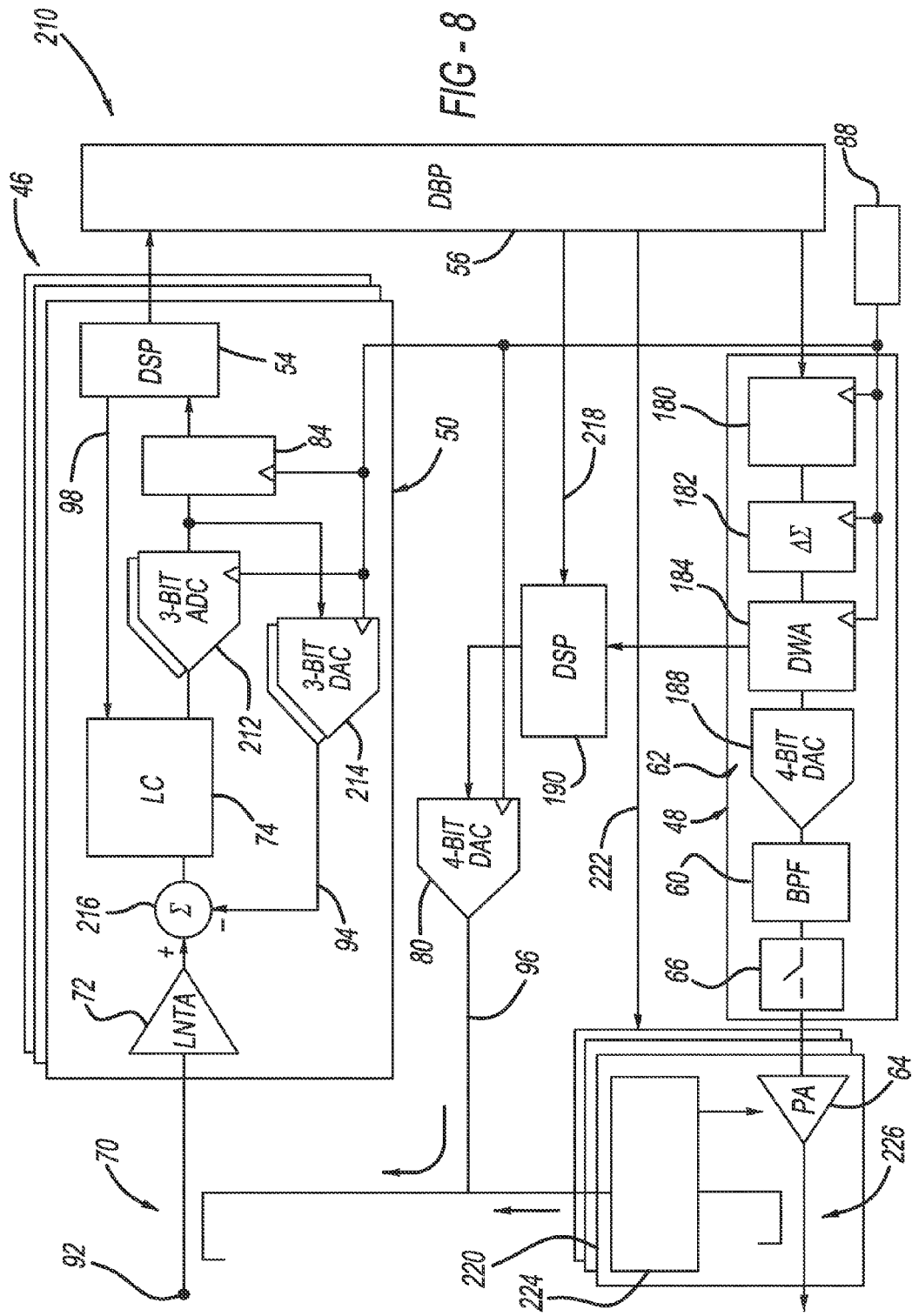

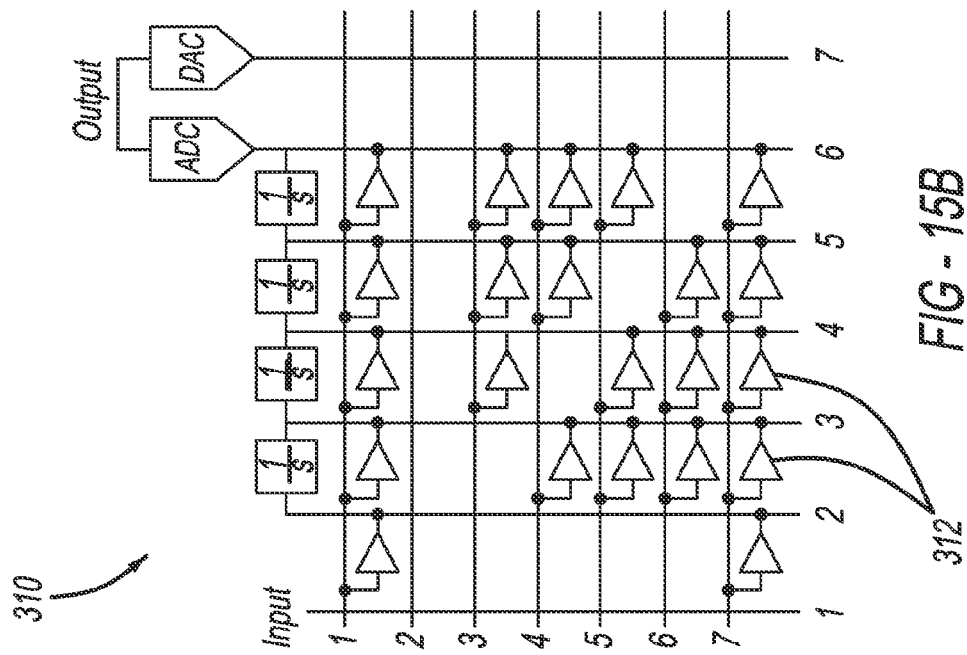
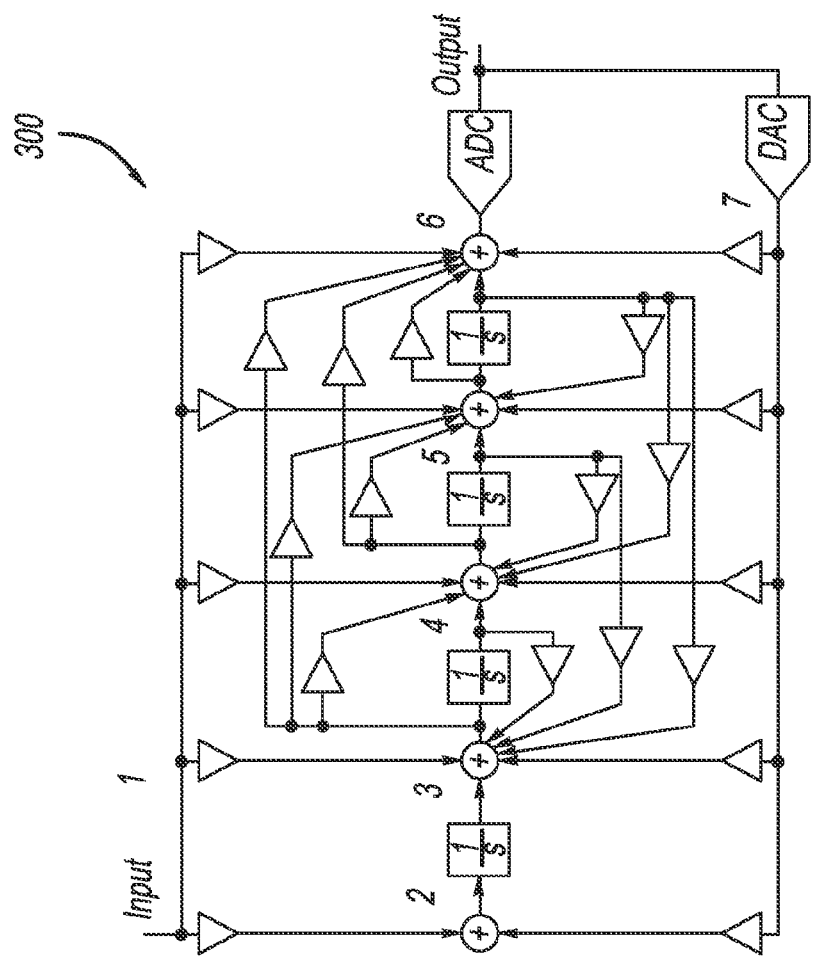
FIG - 15A
FIG - 15B

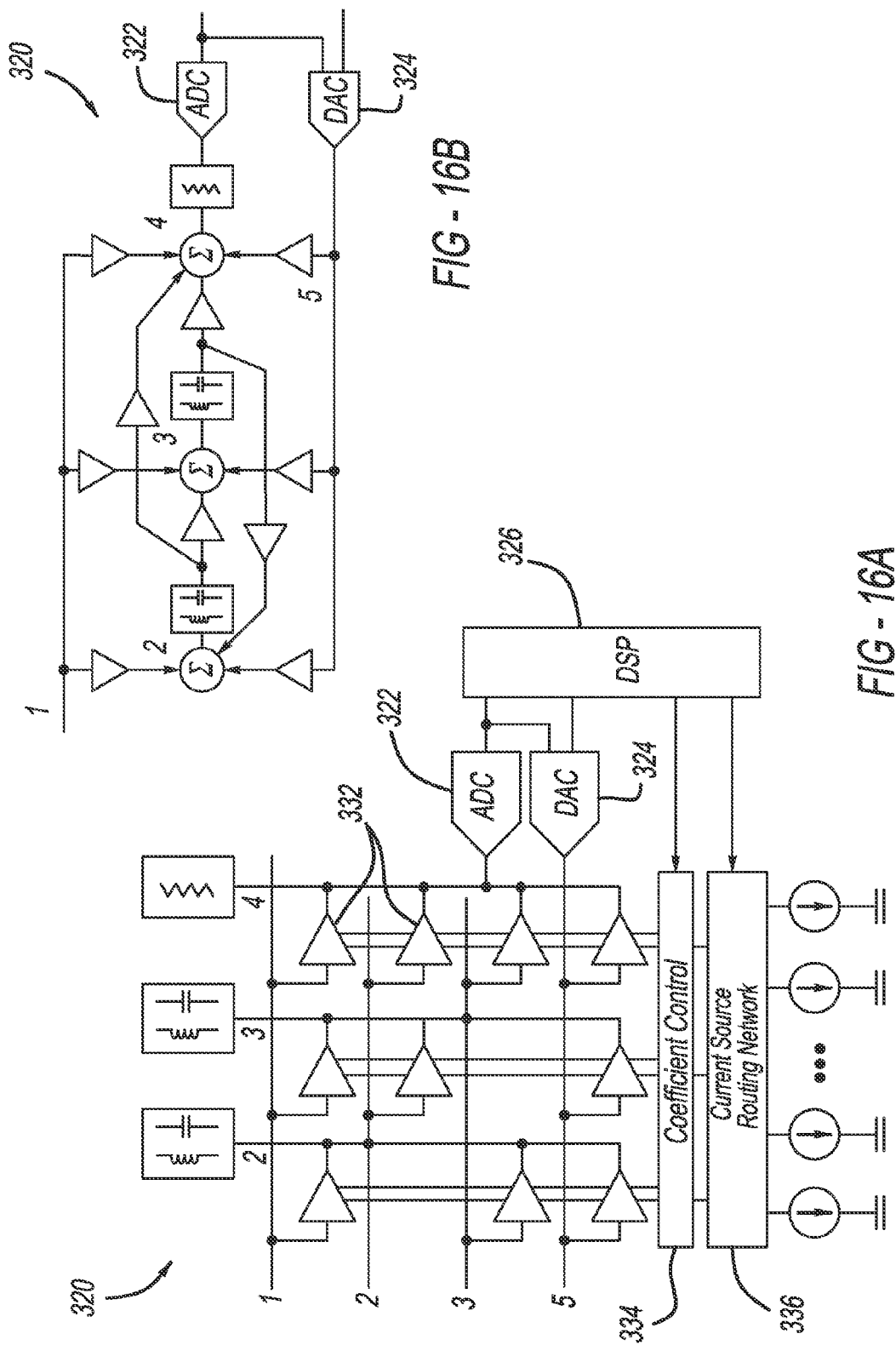

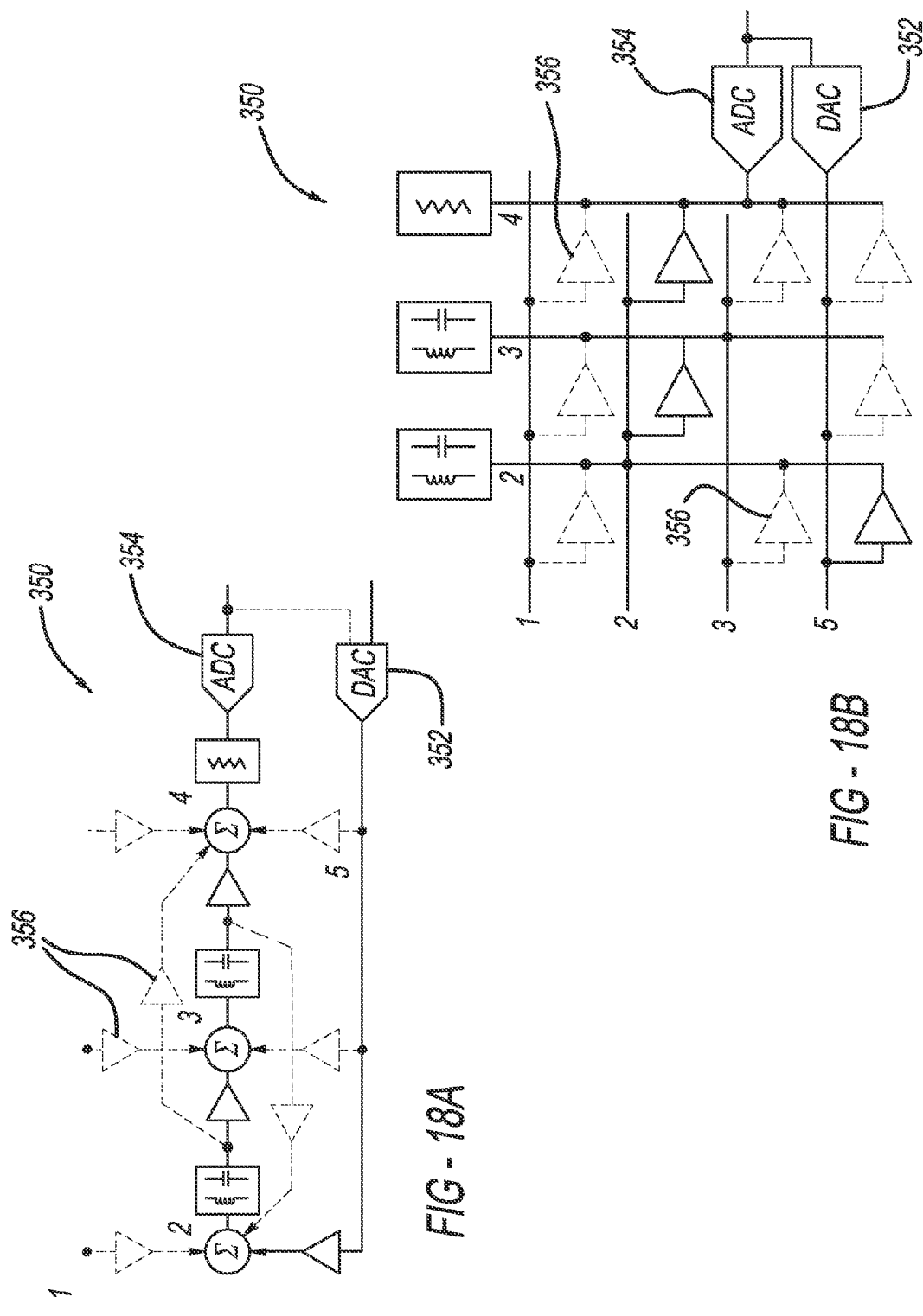

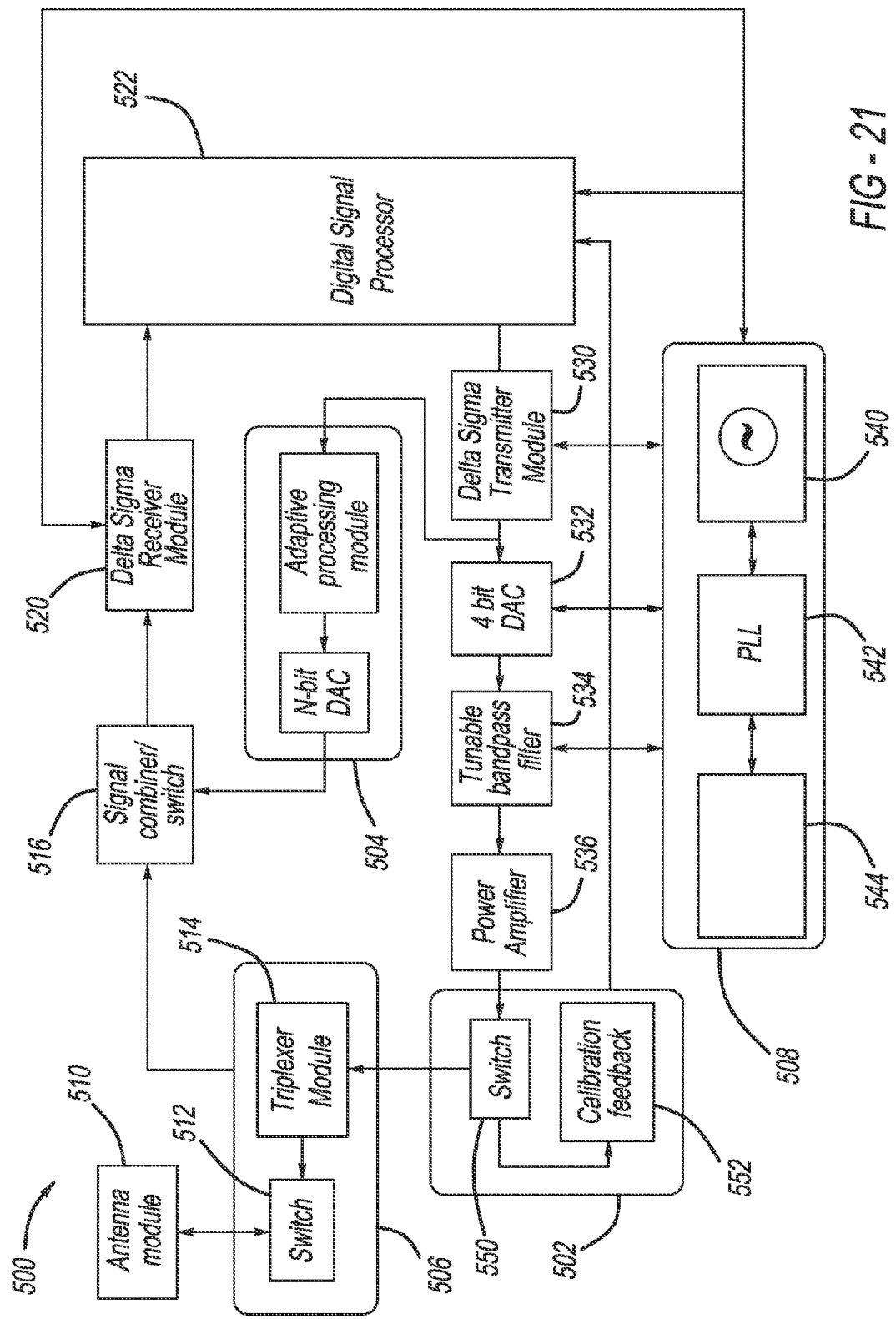

HIGH OVERSAMPLING RATIO DYNAMIC ELEMENT MATCHING SCHEME FOR HIGH DYNAMIC RANGE DIGITAL TO RF DATA CONVERSION FOR RADIO COMMUNICATION SYSTEMS

CROSS-REFERENCE TO RELATED APPLICATIONS

This application claims the benefit of the priority date of U.S. Provisional Patent Application Ser. No. 62/076,363, entitled, "High Oversampling Ratio Dynamic Element Matching Scheme for High Dynamic Range Digital to RF Data Conversion for Radio Communication Systems," filed Nov. 6, 2014.

BACKGROUND OF THE INVENTION

Field of the Invention

This invention relates generally to an RF transmitter module for a cellular radio that includes a delta-sigma modulator and, more particularly, to an RF transmitter module for a cellular radio that includes a delta-sigma modulator having a plurality of interleaving dynamic element matching (DEM) circuits providing interleaved digital bits at a reduced clock rate.

Discussion of the Related Art

Traditional cellular telephones employ different modes and bands of operation that have been supported in hardware by having multiple disparate radio front-end and baseband processing chips integrated into one platform, such as tri-band or quad-band user handsets supporting global system for mobile communications (GSM), general packet radio service (GPRS), etc. Known cellular receivers have integrated some of the antenna and baseband data paths, but nevertheless the current state of the art for mass mobile and vehicular radio deployment remains a multiple static channelizing approach. Such a static architecture is critically dependent on narrow-band filters, duplexers and standard-specific down-conversion to intermediate-frequency (IF) stages. The main disadvantage of this static, channelized approach is its inflexibility with regards to the changing standards and modes of operation. As the cellular communications industry has evolved from 2G, 3G, 4G and beyond, each new waveform and mode has required a redesign of the RF front-end of the receiver as well as expanding the baseband chip set capability, thus necessitating a new handset. For automotive applications, this inflexibility to support emerging uses is prohibitively expensive and a nuisance to the end-user.

Providing reliable automotive wireless access is challenging from an automobile manufacturers point of view because cellular connectivity methods and architectures vary across the globe. Further, the standards and technologies are ever changing and typically have an evolution cycle that is several times faster than the average service life of a vehicle. More particularly, current RF front-end architectures for vehicle radios are designed for specific RF frequency bands. Dedicated hardware tuned at the proper frequency needs to be installed on the radio platform for the particular frequency band that the radio is intended to operate at. Thus, if cellular providers change their particular frequency band, the particular vehicle that the previous band was tuned for, which may have a life of 15 to 20 years, may not operate efficiently at the new band. Hence, this requires automobile manufactures to maintain a myriad of radio platforms, components and suppliers to support each deployed standard, and to provide a path to upgradability as the cellular landscape changes, which is an expensive and complex proposition.

Known software-defined radio architectures have typically focused on seamless baseband operations to support multiple waveforms and have assumed similar down-conversion-to-baseband specifications. Similarly, for the transmitter side, parallel power amplifier chains for different frequency bands have typically been used for supporting different waveform standards. Thus, receiver front-end architectures have typically been straight forward direct sampling or one-stage mixing methods with modest performance specifications. In particular, no prior application has required a greater than 110 dB dynamic range with associated IP3 factor and power handling requirements precisely because such performance needs have not been realizable with complementary metal oxide semiconductor (CMOS) analog technology. It has not been obvious how to achieve these metrics using existing architectures for CMOS devices, thus the dynamic range, sensitivity and multi-mode interleaving for both the multi-bit analog-to-digital converter (ADC) and the digital-to-analog converter (DAC) is a substantially more difficult problem.

Software-defined radio architectures do not currently exist in the automotive domain, but have been proposed and pursued in other nonautomotive applications, such as military radios with multi-band waveforms. However, in those areas, because of vastly different waveform needs, conflicting operational security needs and complex interoperability requirements, a zero-IF approach has proven technically difficult. Known software defined radios have typically focused on backend processing, specifically providing seamless baseband operations to support multiple waveforms. The modest performance specifications haven't demanded anything more aggressive from front-end architectures. Straight-forward direct sampling or 1-stage mixing methods have been sufficient in the receiver. For software defined radios that employ delta-sigma modulators, the component function is commonly found after a down-conversion stage and has low-pass characteristics. With regard to the transmitter, parallel multiple power amplifier chains to support differing frequency bands and waveform standards have been sufficient for meeting the requirements.

As radio systems evolve toward compact multi-function operation, the dynamic range of the receiver is heavily challenged by having to detect a very weak desired signal in the presence of the radios large transmit signal. Less than ideal antenna reflection and imperfect transmit-to-receive isolation may present a fairly large transmit signal at a frequency near the smaller desired receive signal frequency. The impact of this imperfect isolation and antenna reflection has traditionally been resolved through the use of static surface acoustic wave (SAW) or bulk acoustic wave (BAW) filters. However, these types of filters are generally employed for fixed frequencies and do not support a reconfigurable radio architecture.

To obtain the benefits of a full duplex mode operation, i.e., receiving and transmitting at the same time, it is necessary to eliminate or greatly reduce the level of self-interference cause by the transmit signal. In the recent literature, several cancellation schemes have been identified almost all of which have been narrow-band approaches given the nature of the transmit/receive amplifiers, and most have been directed towards interference from external sources as opposed to self-interference cancellation. The techniques for external interference cancellation necessarily have to rely on unknown signal estimation methods, and thus cannot achieve the same dynamic range that is required for wideband sigma-delta modulations applications.

Other related approaches for transmit signal cancellation require multiple antennas to effectively move the duplexing problem from the frequency and/or time domain to the spatial domain, which relies on the placement of the antennas to null the interfering signal. With the desire for smaller transceiver designs and multiple-input multiple-output (MIMO) integration requiring its own antenna resources, having multiple antenna dedicated to the function of self interference cancellation is unattractive.

A handful of RF cancellation schemes requiring only a single antenna have been identified in the art. In these approaches, a sample or replica of the transmitted signal is modified and combined with other signals entering the receiver to cancel the self-interfering signal. The proposed solutions have been for narrow band application and either suffer insertion loss or require extra hardware and are expensive.

Delta-sigma modulators are becoming more prevalent in digital receivers because, in addition to providing wideband high dynamic range operation, the modulators have many tunable parameters making them a good candidate for reconfigurable systems. Interesting possibilities occur for transmit signal cancellation when a bandpass delta-sigma modulator is used as the front end of an ADC. Wider-dynamic range operation can be achieved by moving the low noise amplifier (LNA) in the receiver front-end after the primary feedback summation node in the modulator so that the signal into the LNA is the error or difference between the input and the estimated or quantized version of the input signal. Derived from the quantization error, it can be found that the input power is reduced by the number of DAC bits. Accordingly, the required input intercept point decreases by the same amount for a fixed dynamic range.

Since the performance requirements on a feedback DAC are the same as the overall modulator, the larger the number of bits in the DAC, the harder it is to meet the dynamic range. For those applications where it is not feasible to have a high bit resolution DAC an alternate technique for cancellation is needed. For example, it is possible to leverage the modified modulator architecture to augment RF cancellation by replicating the transmit signal, and then subtracting it along with the quantized estimation signal. The transmitter directly synthesizes the RF signal in the digital domain so that the digital data is readily available. The transmit data sequence is then converted to an analog signal with an N-bit replica DAC. The feedback DAC, the transmit DAC, and the replica DAC have a particular multi-bit resolution. Although there are no constraints on the multi-bit resolution, having the bit resolution of the replica DAC be equal to or less than the transmit DAC is the most efficient implementation and offers the highest potential for circuit and design reuse. The digital data will be modified by the adaptive processing function so that the replicated transmit signal, particularly the phase and strength, is a better approximation to the unwanted signal arriving at the receiver input.

SUMMARY OF THE INVENTION

The present disclosure describes an RF transmitter module for a cellular radio that includes a delta-sigma modulator having a plurality of interleaving dynamic element matching (DEM) circuits providing interleaved digital bits at a reduced clock rate. An interleaver controller controls the DEM circuits so as to provide groups of the digital bits at different points in time. In one embodiment, a summation junction adds the groups of the digital bits to provide a continuous stream of the interleaved digital bits, a DAC converts the stream of interleaved digital bits to an analog signal, and a power amplifier amplifies the analog signal. In an alternate embodiment, a separate DAC receives the digital bits from each DEM circuit and converts the interleaved digital bits to an analog signal, a summation junction adds the analog signal from each of the DACs to provide a combined analog signal, and a power amplifier for amplifying the combined analog signal. In another embodiment, a separate DAC receives the digital bits from each DEM circuit and converts the interleaved digital bits to an analog signal, a separate power amplifier receives and amplifies the analog signal from each of the DACs, and a summation junction adds the analog signals from each of the power amplifiers.

Additional features of the present invention will become apparent from the following description and appended claims, taken in conjunction with the accompanying drawings.

BRIEF DESCRIPTION OF THE DRAWINGS

FIG. 8 is a block diagram of another transceiver for the radio architecture shown in FIG. 2 similar to the transceiver shown in FIG. 3 and including analog and digital self-interference cancellation functions;

FIG. 9 is a schematic block diagram of a digital bandpass delta-sigma modulator for the transmitter module shown in FIGS. 3 and 8;

FIGS. 16 A & B are schematic diagrams of a fourth order sigma-delta modulator including a gm-array used for circuit connectivity and control;

FIGS. 18 A & B are schematic diagrams of the fourth order sigma-delta modulator of FIG. 16 where the gm-array is used to optimize dynamic range;

FIG. 21 is a schematic diagram of a transceiver circuit including multiple calibration and correction modules;

DETAILED DESCRIPTION OF THE EMBODIMENTS

The following discussion of the embodiments of the invention directed to a cellular radio architecture is merely exemplary in nature, and is in no way intended to limit the invention or its applications or uses. For example, the radio architecture of the invention is described as having application for a vehicle. However, as will be appreciated by those skilled in the art, the radio architecture may have other applications other than automotive applications.

The technologies discussed herein are applicable to more than cellular wireless technologies, for example, WiFi (IEEE 802.11) technologies. Further, the cellular radio architecture is presented as a fully duplexed wireless system, i.e., one that both transmits and receives. For wireless services that are receive only, such as global positioning system (GPS), global navigation satellite system (GNSS) and various entertainment radios, such as AM/FM, digital audio broadcasting (DAB), SiriusXM, etc., only the receiver design discussed herein would be required. Also, the described radio architecture design will enable one radio hardware design to function globally, accommodating various global wireless standards through software updates. It will also enable longer useful lifespan of the radio hardware design by enabling the radio to adapt to new wireless standards when they are deployed in the market. For example, 4G radio technology developments and frequency assignments are very dynamic. Thus, radio hardware deployed in the market may become obsolete after just one or two years. For applications, such as in the automotive domain, the lifespan can exceed ten years. This invention enables a fixed hardware platform to be updateable through software updates, thus extending the useful lifespan and global reuse of the hardware.

Figure 1:
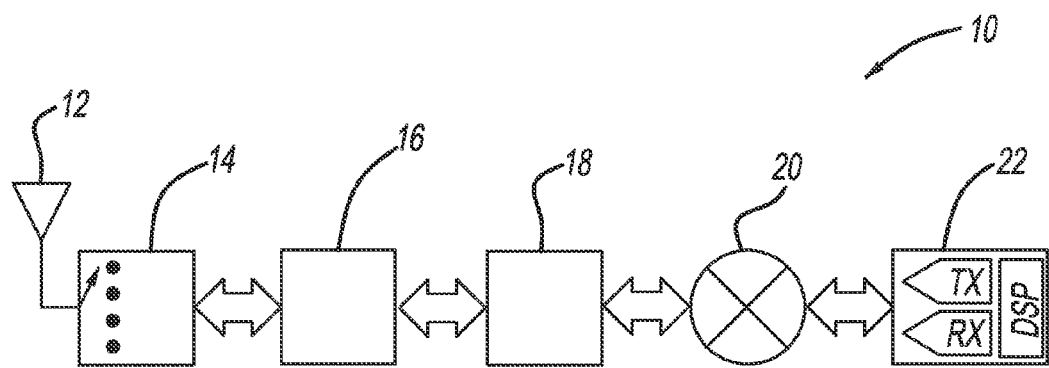
FIG. 1 is a block diagram of a known multi-mode, multi-band cellular communications handset architecture.

FIG. 1 is a block diagram of a known multi-mode, multi-band cellular communications user handset architecture 10 for a typical cellular telephone. The architecture 10 includes an antenna structure 12 that receives and transmits RF signals at the frequency band of interest. The architecture 10 also includes a switch 14 at the very front-end of the architecture 10 that selects which particular channel the transmitted or received signal is currently for and directs the signal through a dedicated set of filters and duplexers represented by box 16 for the particular channel. Modules 18 provide multi-mode and multi-band analog modulation and demodulation of the receive and transmit signals and separates the signals into in-phase and quadrature-phase signals sent to or received from a transceiver 20. The transceiver 20 also converts analog receive signals to digital signals and digital transmit signals to analog signals. A baseband digital signal processor 22 provides the digital processing for the transmit or receive signals for the particular application.

Figure 2:
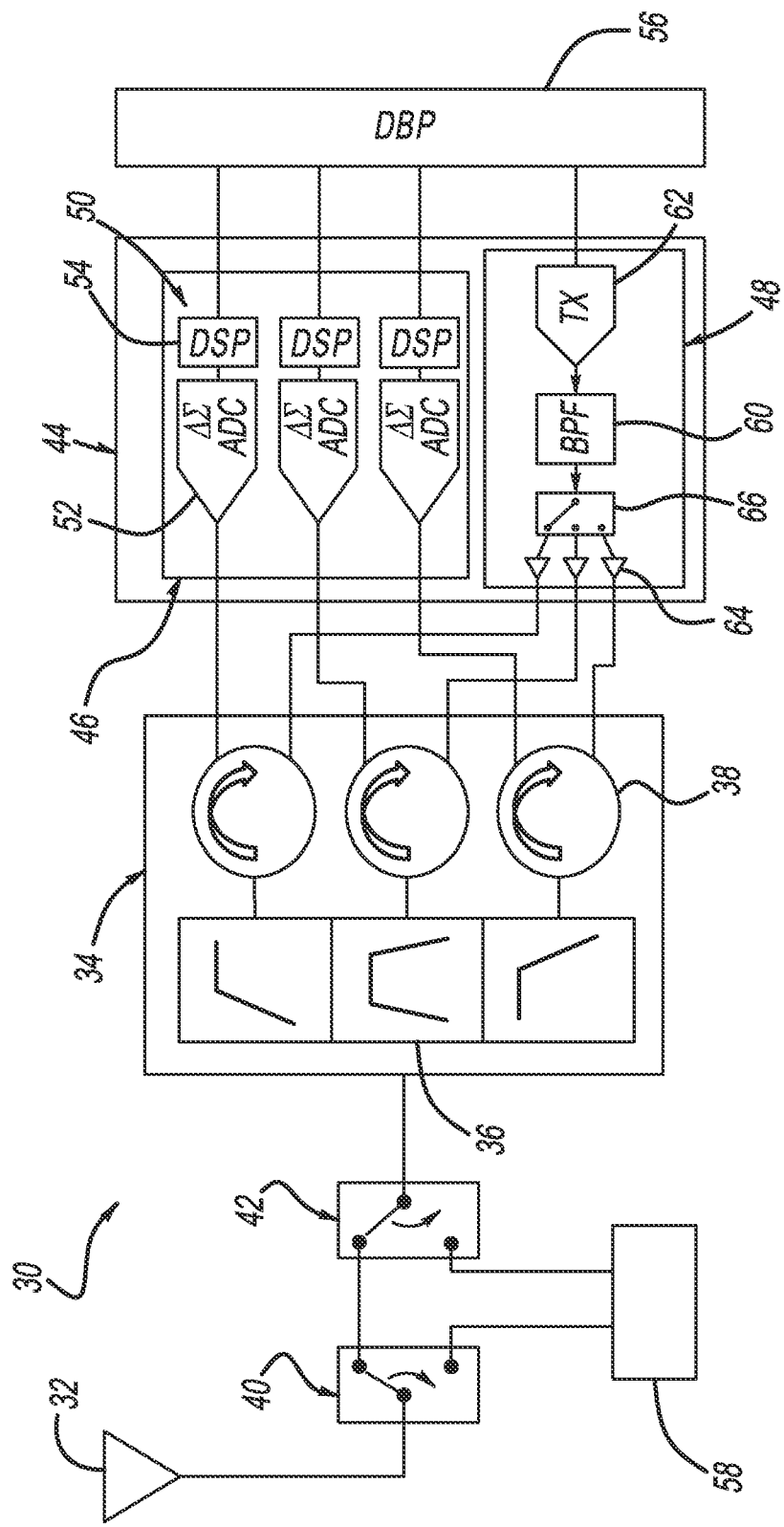
FIG. 2 is a block diagram of a software-programmable cellular radio architecture applicable.

FIG. 2 is a schematic block diagram of a cellular radio front-end architecture 30 that provides software programmable capabilities as will be discussed in detail below. The architecture 30 includes an antenna structure 32 capable of receiving and transmitting the cellular telephone frequency signals discussed herein, such as in a range of 400 MHz-3.6 GHz. Signals received and transmitted by the antenna structure 32 go through a triplexer 34 that includes three signal paths, where each path is designed for a particular frequency band as determined by a bandpass filter 36 in each path. In this embodiment, three signal paths have been selected, however, the architecture 30 could be expanded to a higher number of signal paths. Each signal path includes a circulator 38 that separates and directs the receive and transmit signals, and provides isolation so that the high power signals being transmitted do not enter the receiver side and saturate the receive signals at those frequency bands.

The architecture 30 also includes a front-end transceiver module 44 that is behind the triplexer 34 and includes a receiver module 46 that processes the receive signals and a transmitter module 48 that processes the transmit signals. The receiver module 46 includes three receiver channels 50, one for each of the signal paths through the triplexer 34, where a different one of the receiver channels 50 is connected to a different one of the circulators 38, as shown. Each of the receiver channels 50 includes a delta-sigma modulator 52 that receives the analog signal at the particular frequency band and generates a representative stream of digital data using an interleaving process in connection with a number of N-bit quantizer circuits operating at a very high clock rate, as will be discussed in detail below. As will further be discussed, the delta-sigma modulator 52 compares the difference between the receive signal and a feedback signal to generate an error signal that is representative of the digital data being received. The digital data bits are provided to a digital signal processor (DSP) 54 that extracts the digital data to provide the audio content in the receive signal. A digital baseband processor (DBP) 56 receives and operates on the digital data stream for further signal processing in a manner well understood by those skilled in the art. The transmitter module 48 receives digital data to be transmitted from the processor 56. The module 48 includes a transmitter circuit 62 having a delta-sigma modulator that converts the digital data to an analog signal. The analog signal is filtered by a tunable bandpass filter (BPF) 60 to remove out of band emissions and sent to a switch 66 that directs the signal to a selected power amplifier 64 optimized for the transmitted signal frequency band. The amplified signal is sent to the particular circulator 38 in the triplexer 34 depending on which frequency is being transmitted.

As will become apparent from the discussion below, the configuration of the architecture 30 provides software programmable capabilities through high performance delta-sigma modulators that provide optimized performance in the signal band of interest and that can be tuned across a broad range of carrier frequencies. The architecture 30 meets current cellular wireless access protocols across the 0.4-2.6

GHz frequency range by dividing the frequency range into three non-continuous bands. However, it is noted that other combinations of signal paths and bandwidth are of course possible. The triplexer 34 implements frequency domain de-multiplexing by passing the RF carrier received at the antenna structure 32 into one of the three signal paths. Conversely, the transmit signal is multiplexed through the triplexer 34 onto the antenna structure 32. For vehicular wireless access applications, such a low-cost integrated device is desirable to reduce parts cost, complexity, obsolescence and enable seamless deployment across the globe.

The delta-sigma modulators 52 are positioned near the antenna structure 32 so as to directly convert the RF receive signals to bits in the receiver module 46 and bits to an RF signal in the transmitter module 48. The main benefit of using the delta-sigma modulators 52 in the receiver channels 50 is to allow a variable signal capture bandwidth. This is possible because the architecture 30 enables software manipulation of the modulator filter coefficients to vary the signal bandwidth and tune the filter characteristics across the RF band, as will be discussed below.

The architecture 30 allows the ability to vary signal capture bandwidth, which can be exploited to enable the reception of continuous carrier aggregated waveforms without the need for additional hardware. Carrier aggregation is a technique by which the data bandwidths associated with multiple carriers for normally independent channels are combined for a single user to provide much greater data rates than a single carrier. Together with MIMO, this feature is a requirement in modern 4G standards and is enabled by the orthogonal frequency division multiplexing (OFDM) family of waveforms that allow efficient spectral usage.

The architecture 30 through the delta-sigma modulators 52 can handle the situation for precise carrier aggregation scenarios and band combinations through software tuning of the bandpass bandwidth, and thus enables a multi-segment capture capability. Dynamic range decreases for wider bandwidths where more noise is admitted into the sampling bandpass. However, it is assumed that the carrier aggregation typically makes sense when the user has a good signal-to-noise ratio, and not cell boundary edges when connectivity itself may be marginal. Note that the inter-band carrier aggregation is automatically handled by the architecture 30 since the triplexer 34 feeds three independent modulators in the channels 50.

The circulators 38 route the transmit signals from the transmitter module 48 to the antenna structure 32 and also provide isolation between the high power transmit signals and the receiver module 46. Although the circulators 38 provide significant signal isolation, there is some port-to-port leakage within the circulator 38 that provides a signal path between the transmitter module 48 and the receiver module 46. A second undesired signal path occurs due to reflections from the antenna structure 32, and possible other components in the transceiver. As a result, a portion of the transmit signal will be reflected from the antenna structure 32 due to a mismatch between the transmission line impedance and the antenna's input impedance. This reflected energy follows the same signal path as the incoming desired signal back to the receiver module 46.

As will be discussed in detail below, the present invention proposes an interference cancellation scheme that rejects the self-generated interference leaking into the receiver path from the transmitter module 48, and is incorporated into the delta-sigma modulator architecture to support full-duplex wireless transmission in the software programmable receiver. The proposed transceiver architecture employs an adaptive cancellation scheme to attenuate the interfering transmit signal into the ADC implemented by the delta-sigma modulator 52. The reduction in transmitted power need only be sufficient for linear processing by the delta-sigma modulator 52 so that the additional digital cancellation of the signal may be performed in the post-processing circuitry, i.e., the DSP 54 and the DBP 56.

The proposed technique for self-interference cancellation leverages the unique properties of delta-sigma modulator architectures to add functionality in a hardware efficient manner. The transmit signal leakage information is already known prior to the actual cancellation point in the receiver module 46. Accordingly, as part of the transceiver initialization, the receiver channel 50 can be characterized and since the digital information signal is known, all of the interference correction can be pre-distorted in the digital domain. This is different than in most of the known interference cancellation schemes. Also, in the embodiments where the receiver modulator architecture with the feedback signal precedes the low noise amplifier, the transceiver already employs a directional coupler so it is not necessary to add any additional hardware in the receiver path. As will be described, in one approach the cancellation technique generates a cancellation vector that is a modified version of the transmit signal to cancel the self-interference signal from entering the receiver module 46. The creation of the cancellation vector is unique in that the bandpass delta-sigma modulator 52 for the ADC is used in the receiver channel 50.

The architecture 30 is also flexible to accommodate other wireless communications protocols. For example, a pair of switches 40 and 42 can be provided that are controlled by the DSP 56 to direct the receive and transmit signals through dedicated fixed RF devices 58, such as a global system for mobile communications (GSM) RF front end module or a WiFi finite element method (FEM). In this embodiment, some select signal paths are implemented via conventional RF devices. FIG. 2 only shows one additional signal path, however, this concept can be expanded to any number of additional signal paths depending on use cases and services.

Figure 3:
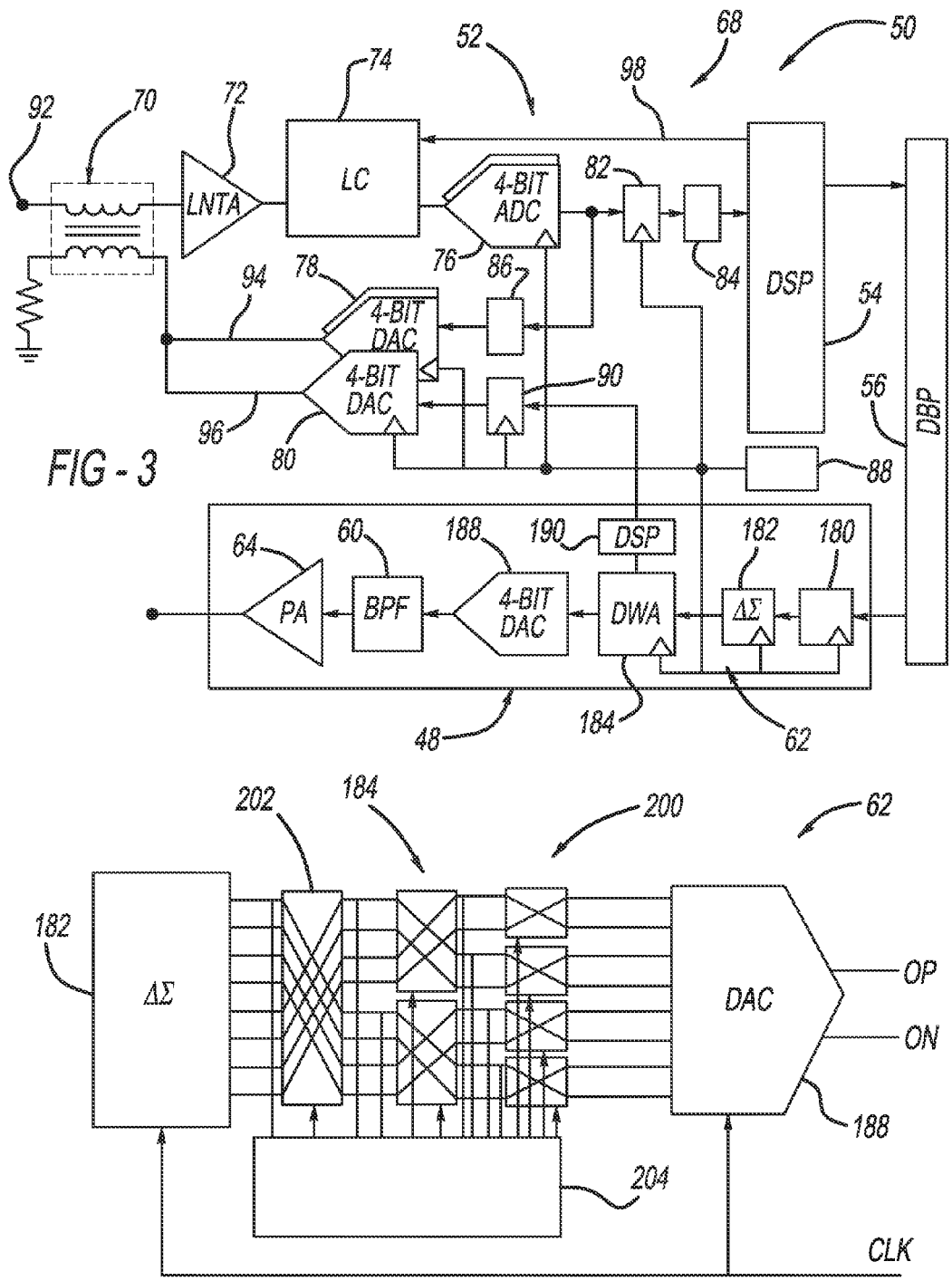
FIG. 3 is a block diagram of a transceiver for the radio architecture shown in FIG. 2 including one of the receiver channels having a delta-sigma modulator showing interleaved quantizers and a transmitter module.

FIG. 3 is a schematic block diagram of an architecture 68 that is a portion of the architecture 30 including one of the receiver channels 50 having the delta-sigma modulator 52 and the DSP 54, the transmitter module 48 and the baseband processor 56. The receive signals from the circulator 38 at node 92 are provided to a broadband combiner 70 operating as a summation junction. A receive feedback signal on a feedback line 94 and a transmit cancellation signal on line 96 are also provided to the combiner 70 and are subtracted from the receive signal to generate an analog error signal that is sent to a low noise transconductance amplifier (LNTA) 72. The desired signal component of the receive signal is unaffected by the signal cancellation circuitry, but the unwanted transmit signal energy is reduced by the transmit cancellation signal. The amplified error signal is provided to a sixth-order LC filter 74, where the filter 74 operates as a bandpass filter to reshape the noise in the analog error signal so that it is out of the desired signal band, thus obtaining quality signal-to-noise and distortion performance.

In low-pass or low-IF bandwidth modular designs having a faster clock rate means a higher oversampling ratio (OSR), i.e., the ratio of the clock speed to twice the signal bandwidth, which means better dynamic range. In a high-RF bandpass design, the clock rate is constrained by the clock-to-carrier ratio. For a sampling rate to RF carrier frequency ratio less than four, the digital filter becomes substantially more complicated. To meet cellular standards in the high receive band up to 2.6 GHz, a clock rate of 10.4 GHz would be required. However, for these clock rates, achieving 100 dB of dynamic range in the analog feedback signal to the combiner 70 is unrealistic. To address this challenge, the present invention provides interleaved quantizer circuits to reduce the clock rate to 5.2 GHz. The quantizer circuits are clocked at half rate, but the achieved clock rate is still 10.4 GHz, which has the advantage of maintaining an OSR greater than 512 for a 20 MHz signal band, but making stability more challenging since the feedback delay is relative to the effective clock period it is easier to exceed a threshold for stability.

Based on this discussion, the filtered error signal from the filter 74 is provided to a series of multi-bit ADCs 76, here 4-bits although other multi-bit ADCs can be employed, such as two or three bit ADCs. The ADCs 76 convert the error signal to a digital signal in a serial interleaving manner at the output of the ADC 76. Interleaving as used herein means that the analog carrier frequency from the filter 74 is processed in separate sections by the plurality of the ADCs 76 so that the rate at which the conversion process is being performed can be reduced. Those bits are sent to a series of 4-bit DACs 78, although other multi-bit ADCs can be employed, such as two or three, in the feedback line 94, where the combination of each pair of the ADC 76 and the DAC 78 is a quantizer circuit that operates as a 4-bit interleaver on multiple groups of 4-bits, as will be discussed in further detail below. An upper bound on the number of bits is set by the ability to design the DAC 78 to meet the dynamic range of the system. Unlike the 4-bit ADC 76 that is in the forward path of the modulator 52, the non-linearities of the DAC 78 are not shaped by the filter 74 and directly affect the performance. The interleaving process provides the groups of 4-bits from the ADCs 76 through a data weighted averaging (DWA) digital shaper circuit 86 before being provided to the DACs 78. Because interleaving allows the sampling rate to be reduced oversampling to maintain bit integrity is not required. Thus the bit resolution is four in this embodiment, but each pair of the ADCs 76 and the DACs 78 in the quantizer circuit need only operate at half-speed making it easier to meet dynamic range requirements.

Interleaving both the multi-bit ADCs 76 and DACs 78 as proposed herein is a substantially harder problem than addressed in the prior art. Meeting dynamic range goals requires matching among the interleaved ADCs 76 and the DACs 78 in addition to managing mismatch within an individual DAC. Also, interleaving increases the excess phase delay in the loop and requires compensation to maintain stability. The clock rates in delta-sigma ADC designs used herein are typically as fast as possible without degrading the modulator performance by introducing jitter into the system. It is noted that the order of the delta-sigma modulators is design specific for a particular implementation.

Figure 4:
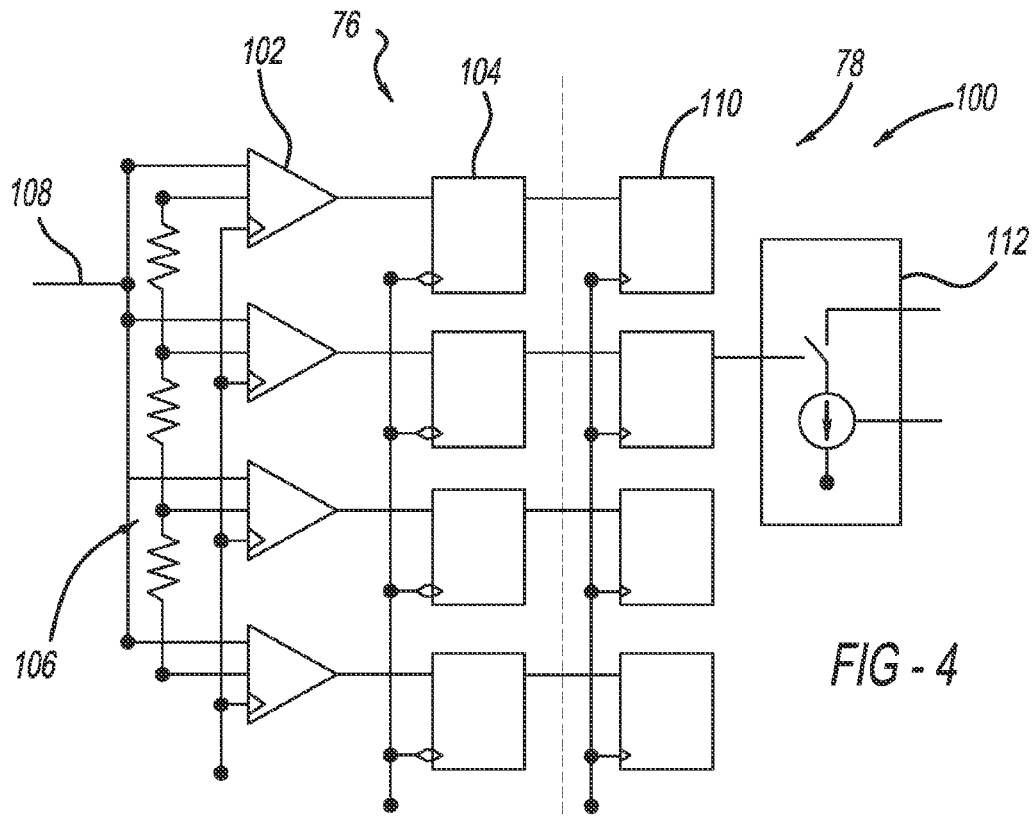
FIG. 4 is a schematic diagram of a multi-bit quantizer employed in the delta-sigma modulator shown in FIG. 3.

FIG. 4 is a schematic diagram of a quantizer circuit 100 defined by one group of the ADCs 76 and the DACs 78. The ADC 76 and the DAC 78 include a bit path for each bit in the multi-bit quantizer. Each signal path in the ADC 76 includes a comparator 102 and a latch 104. A voltage divider network 106 sets a different reference voltage for each of the comparators 102 in each of the signal paths. The analog signal from the filter 74 is provided on line 108 and is sent to each of the comparators 102. If that voltage level is above the reference level for the particular comparator 102, then the latch 104 for that channel is set high for that bit. The DAC 78 includes latches 110 that reset the bits back to an analog signal through a switch 112.

Delta-sigma modulators are a well known class of devices for implementing analog-to-digital conversion. The fundamental properties that are exploited are oversampling and error feedback (delta) that is accumulated (sigma) to convert the desired signal into a pulse modulated stream that can subsequently be filtered to read off the digital values, while effectively reducing the noise via shaping. The key limitation of known delta-sigma modulators is the quantization noise in the pulse conversion process. Delta-sigma converters require large oversampling ratios in order to produce a sufficient number of bit-stream pulses for a given input. In direct-conversion schemes, the sampling ratio is greater than four times the RF carrier frequency to simplify digital filtering. Thus, required multi-GHz sampling rates have limited the use of delta-sigma modulators in higher frequency applications. Another way to reduce noise has been to use higher order delta-sigma modulators. However, while first order canonical delta-sigma architectures are stable, higher orders can be unstable, especially given the tolerances at higher frequencies. For these reasons, state of the art higher order delta-sigma modulators have been limited to audio frequency ranges, i.e., time interleaved delta-sigma modulators, for use in audio applications or specialized interleaving at high frequencies. The present invention improves upon prior approaches through the sixth-order filter 74 with the feedback structure for maximum flexibility in the noise shaping characteristics. The modulators 52 can achieve a dynamic range of 100 dB over a signal bandwidth of 20 MHz across an RF bandwidth of 400 MHz.

A decoder 82 receives the multi-bit sequence from all of the ADCs 76 simultaneously and reconfigures the bits in the proper orientation to be output as a serial data stream. The bits are then provided to a de-multiplexer 84 to provide the data stream at the lower clock rate. Particularly, the output data bits from the ADCs 76 are decoded from thermometer code to binary code and de-multiplexed down to a data rate that can be supported by the DSP 54. Operational parameters for the filter 74 are set by the DSP 54 and are provided on line 98. Also, a calibration phase is performed to optimize the performance for the receive channel 50. A clocking device 88 provides the clock signals to the various components in the architecture 68, as shown, where the frequency of the clock rate determines power consumption and semiconductor material as will be discussed in further detail below.

Figure 5:
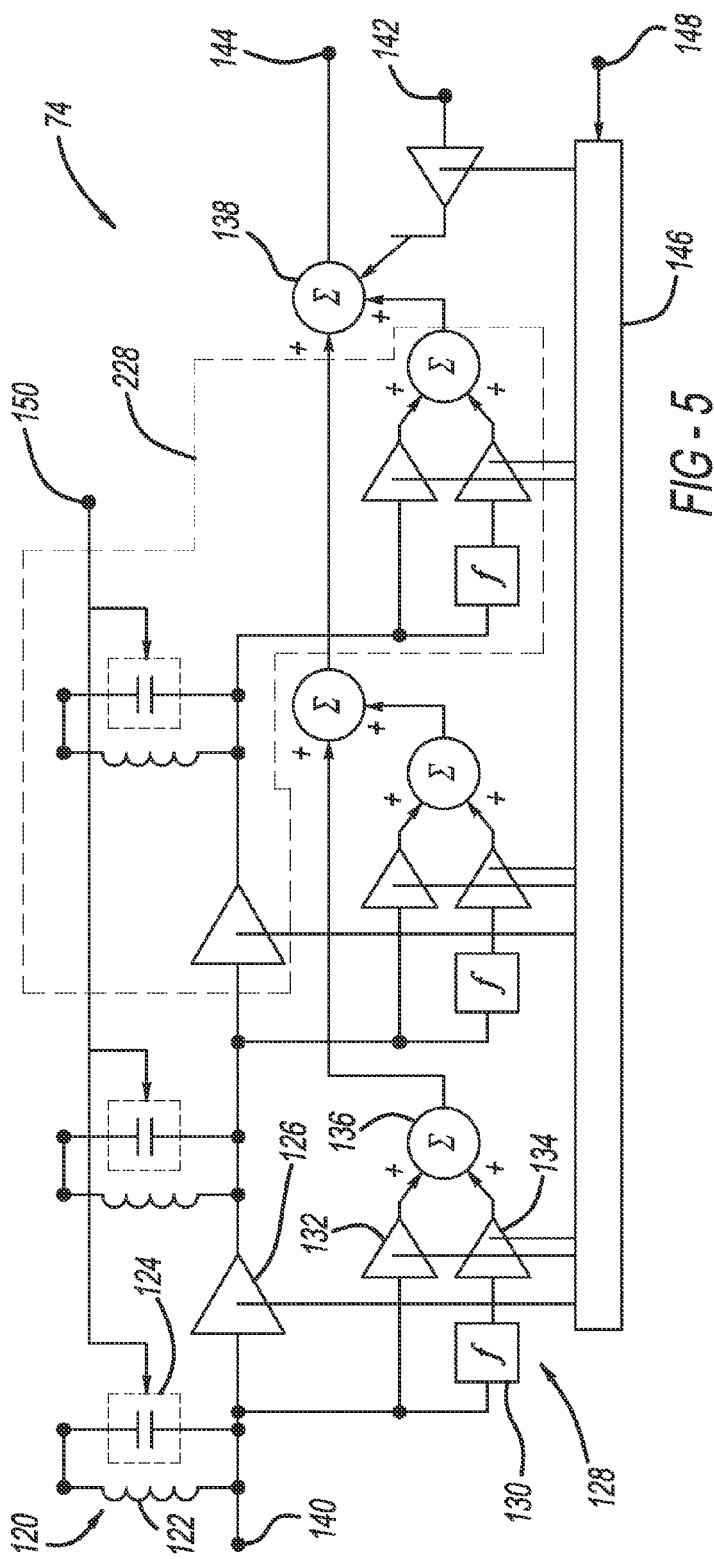
FIG. 5 is a schematic block diagram of the sixth-order filter employed in the delta-sigma modulator shown in FIG. 3.

FIG. 5 is a schematic diagram of the sixth-order filter 74 that includes three passive LC resonator circuits 120 each including an inductor 122 and a capacitor array 114. As is well understood by those skilled in the art, the number of orders of a particular filter identifies the number of poles, where the number of poles defines the number of LC circuits. Filtering and correction algorithms are applied to the digital output stream in the DSP 54. Low-speed tuning and calibration signals are fed back into the filter 74 on the line 98 for reconfiguring and optimizing the filter 74. The filter 74 also includes a series of transconductance amplifiers 126 in the primary signal path. A feed-forward path provides stability and includes integrator circuits 128 each including an integrator 130, two tunable transconductance amplifiers 132 and 134 and a summer 136. The filter 74 has a feed-forward architecture where signals are fed from early resonator stages into a final summing junction 138. The signal from the LTNA 72 is provided at node 140, and the most significant bit of the 4-bit DAC 78 in the feedback loop on the line 94 is provided at node 142. The output of the filter 74 is provided to the ADCs 76 at node 144. A low-speed DAC array 146 receives coefficient control bits at node 148 from the line 98 to control the functions in the integrator circuits 128. Frequency control bits from the DSP 54 on the line 98 are provided to the capacitor array 124 at node 150.

Although a feedback architecture may offer more out-of-band noise shaping, a feed-forward architecture gives more flexibility in designing a stable modulator. The passive resonator circuits 120 are employed because they have lower noise figures, higher linearity, require less power, and can operate at higher carrier frequencies than active resonators. The quality factor Q of the resonator circuits 120 is primarily set by the series resistance in the inductor 122. Simulations have shown that the resonator Q should be greater than 30 to achieve a deep notch characteristic and will require an off-chip component as it is difficult to achieve the needed performance with an integrated spiral inductor. Simulations also have shown that five sets of coefficients are needed to cover a 400 MHz RF band and the modulator 52 is stable across 100 MHz band, but an extra set allows for frequency overlap. The coefficient set information will be stored in a look-up table in the DSP 54. Control bits will be loaded and sent to the filter 74 to set the notch frequency and component parameters based on RF carrier information.

Figure 6:
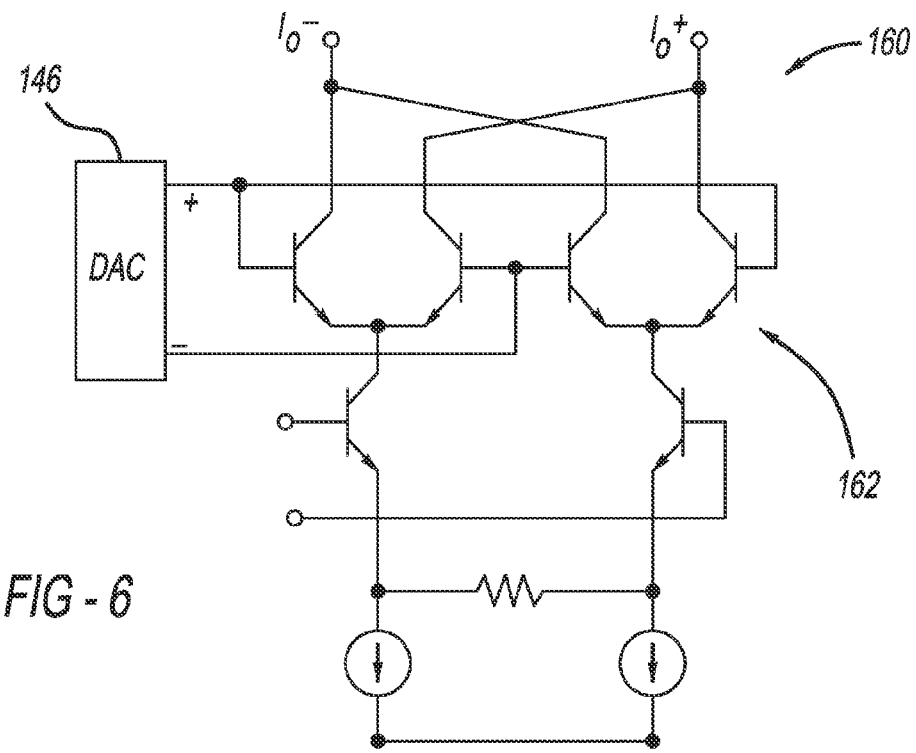
FIG. 6 is a schematic diagram of a tunable transconductance amplifier employed in the sixth-order filter shown in FIG. 5.

FIG. 6 is a schematic diagram of an amplifier circuit 160 implemented in the transconductance amplifiers 126 to show how the coefficients may be adjusted. The gain of the transconductance amplifiers 126 may be varied by applying a differential voltage to a cross-coupled pair of transistors 162. When the differential voltage is zero, there is no gain. For a large positive differential voltage, the amplifier 126 achieves a maximum positive gain and, conversely, for large negative differential voltage, the transconductance gain is maximized and inverted. The differential voltages are converted from the DSP control bits using the low-speed DAC array 146.

Figure 7:
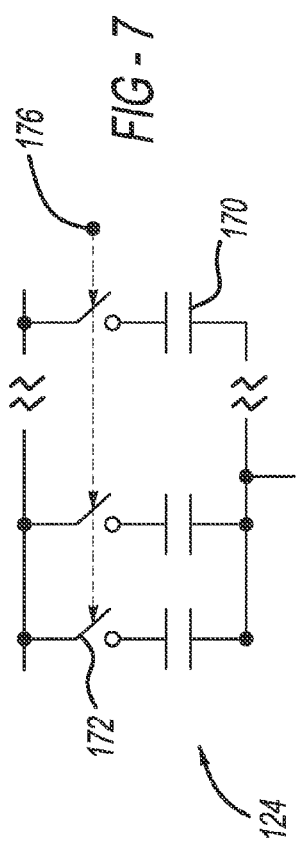
FIG. 7 is a capacitor array providing course and fine tuning employed in one of the resonators in the sixth-order filter shown in FIG. 5.

The inductors 122 will be fixed for each of the three RF bands in the signal paths through the triplexer 34 and the capacitance changed within each band through the capacitor array 124. The size, or more appropriately, the resolution of the capacitor array 124 will be fine enough for narrow frequency selectivity. FIG. 7 is a schematic diagram of one possible embodiment for the capacitor array 124 that provides coarse and fine tuning. The capacitor array 124 includes a plurality of capacitors 170 and switches 172, where the switches 172 are selectively controlled by the frequency notch control signal from the DSP 54 at node 176.

The order of the filter 74, the ratio of the sample rate to signal bandwidth and the number of bits in the quantizer circuit 100 are all chosen to provide a 100 dB dynamic range. The passive resonator circuits 120 with the inductors 122 and the capacitor arrays 124 offer lower-power and wider bandwidth operation. Post-processing, such as filtering, calibration and correction of the output digital data is performed in the DSP 54. The modulators 52 are able to meet the dynamic range requirements by reducing the magnitude of the unwanted transmit signal.

The architecture 68 shows that the transmitter module 48 includes an up-converter 180 that up-converts the digital data to be transmitted from the baseband processor 56 and a delta-sigma modulator 182 that modulates the bits in the manner as discussed herein. The modulated bits are then provided to a DWA circuit 184 and the bits are converted to an analog signal by a 4-bit DAC 188. The analog signal is filtered by the BPF 60 to reduce out-of-band emissions, and then amplified by the power amplifier 64 for the particular frequency band. The switch 66 and the other power amplifiers for the other bands are not shown in FIG. 3. A DSP 190 receives a digital signal from the DWA circuit 184 and provides an in-phase digital representation of the transmit signal for signal cancellation in the combiner 70, as will be discussed in further detail below. The up-converter 180, the delta-sigma modulator 182, the DWA circuit 184, the DAC 188 and the DSP 190 are all part of the transmitter circuit 62.

As mentioned, digital cancellation of the transmit signal is provided by the transceiver. If a transmit signal is occurring in the same frequency range through the same circulator 38 while the delta-sigma modulator 52 is receiving a receive signal on that channel, the transmit signal is also fed back to the combiner 70. Particularly, the bits from the DWA 184 that are processed by the DSP 190 are latched into a 4-bit delta-sigma DAC 80 by a latch 90 to replicate the transmit signal on the line 96 provided to the combiner 70. The DSP 190 delays the bits so that the bits converted by the DAC 80 and provided to the combiner 70 are in phase with the actual transmit signal when it is received at the combiner 70 to create a null at the frequency of the transmit signal in the receiver channel 50. The DSP 190 will periodically provide calibration bits to the DAC 80 to identify the particular phase at any given point in time, where that signal when processed by the receiver channel 50 will be identified by the DBP 56. By adjusting the phase of the calibration signal so a null is processed by the receiver channel 50 allows a delay in the processing of the digital bits in the DSP 190 to be in phase with the transmitted signal.

The adaptive cancellation technique leverages the fact that the digital sequence for creating the transmit signal is available and uses the inherent feedback path of the modulator 52. The transmit digital data from the baseband processor 56 is a modified sequence of the actual transmitted signal that has been altered based on the changing environment so that the replicated transmit signal, particularly the phase and strength, is a better approximation to the unwanted signal arriving at the receiver input. The modified transmit data sequence is then converted to an analog signal through the DAC 80. The amount of cancellation needed is determined by the linearity specification of the LNTA 72.

Reducing the signal level into the LNTA 72 eases the linearity requirements of the system for potentially higher dynamic range in the overall modulator. In some scenarios, digital cancellation may not offer enough reduction of the self-interferer. Additional cancellation is achieved by employing RF cancellation techniques in conjunction with digital cancellation techniques. In this embodiment, a small amount of the transmit signal is siphoned off through a coupler in the transmit path. The signal energy is used for envelope tracking to improve the linearity and efficiency of the power amplifier as well as for RF cancellation of the self-interferer. The RF cancellation circuitry modifies the transmit signal for better cancellation at the receiver input. The combination of digital and RF self-interference cancellation can reduce the interferer by 30 dB with relatively little increase in the transceiver complexity. For a transmit power level of 25 dBm, the reflected signal from the antenna structure 32 into the receiver module 46 will be approximately 14 dBm, where a 3:1 VSWR and 1 dB cable loss are assumed. The cancellation schemes bring the unwanted signal power entering the receiver down to −16 dBm.

FIG. 8 is a schematic block diagram of an architecture 210 similar to the architecture 68 illustrating a technique for providing the digital signal cancellation described above in combination with RF or analog signal cancellation, where like elements to the architecture 68 are identified by the same reference number. In this embodiment, the 4-bit ADCs 76 are replaced with 3-bit ADCs 212 and the feedback 4-bit DACs 78 are replaced with 3-bit DACs 214, which provides a different bit resolution for the quantization and interleaving process as discussed above. Also in this embodiment, the analog error signal on the feedback line 94 is provided to a summation node 216 after the LNTA 72 instead of being provided to the combiner 70 so that it is the amplified receive signal from the antenna 32 that is used to generate the error signal provided to the filter 74. In more traditional delta-sigma modulator architectures, where the LNTA 72 precedes the summation node 216 to create the error signal, the digital cancellation scheme may still be applied and is equally effective. In this embodiment, the injection of the reconstructed transmit signal is not coincident with the feedback signal in the receiver delta-sigma modulator 52. The advantage of this approach is that the combiner 70 is removed from the feedback path of the modulator 52 and does not introduce excess loop delay that could cause instability. The phase delay provided by the DSP 190 is controlled by the DBP 56 on line 218.

Modern complex signal modulation schemes, such as long term evolution (LTE) and OFDM, have a relatively large peak-to-average ratio (PAR). Modern complex signal modulation schemes also have signal modulation power levels that can vary significantly, resulting in high peak-to-average signal powers. This can create disadvantages, such as non-linear performance and inefficient power amplifier performance. In order to provide linear amplification in known transceivers, the quiescent operating point of the power amplifier 64 is usually reduced from its maximum power level to accommodate the high PAR of the incoming signal, which decreases its efficiency. A popular solution to mitigate this decrease in efficiency is to use envelope tracking (ET). Envelope tracking dynamically modulates the drain voltage of the power amplifier 64 according to its transmitted signal power level and the transmitter's baseband signal. As a result, the power amplifier 64 only consumes the necessary DC power during transmission, and thus the efficiency is greatly improved. Another advantage of envelope tracking is to incorporate the nonlinearity of the power amplifier 64 during the adjustment of the drain voltage of the power amplifier 64 to further improve its linearity.

For the reasons discussed above, envelope tracking is incorporated into the architecture 210 to provide feedback to the power amplifier 64 to improve the performance of the power amplifier 64. For example, the feedback can be used to adjust the operational point of the power amplifier 64, thus improving its efficiency and linearity. In addition, as will be discussed, the architecture 210 incorporates RF cancellation with the envelope tracking. In this implementation, the DBP 56 can both provide the information required to recreate the transmitted signal and/or the receive information. Thus, the architecture 210 has the capability to measure the non-ideal signal delays and distortion created by the system implementation, including antenna reflections and various impedance non-uniformities, and to provide digital corrections to account for these non-ideal conditions.

The architecture 210 provides RF analog cancellation of the transmit signal through an analog cancellation circuit 220, where, if needed, a separate RF cancellation circuit 220 is provided for each frequency band for each circulator 38, and where the particular power amplifier 64 is in the circuit 220 because it is tuned to that particular band. Envelope tracking as discussed above is incorporated into the circuit 220 that can be used to adjust the operational point of the power amplifier 64, thus improving its efficiency and linearity. In each of the circuits 220, a small portion of the transmit signal is tapped off by a coupler 226 and provided to an RF cancellation and envelope tracking circuit 224 that tracks the receive signal and the transmit signal to provide a modulation signal to the drain of the power amplifier 64, and provide a copy of the reflected transmit signal. In this implementation, the DBP 56 can both provide information required to recreate the transmitted signal and receive information from the RF cancellation and envelope tracking circuit 224. Thus, the architecture 210 has the capability to measure the non-ideal signal delays and distortion created by the system implementation, as referred to above. The processed tapped signal is provided to the combiner 70 along with the digital cancellation signal on the line 96 to remove the reflected transmit signal in the receiver channel 50 as much as possible. The circuit 224 also provides signal information to the power amplifier 64 to improve linearity and efficiency.

For the cellular application discussed herein that covers multiple assigned frequency bands, a transmitter with multi-mode and multi-band coverage is required. Also, many current applications mandate transmitters that rapidly switch between frequency bands during the operation of a single communication link, which imposes significant challenges to typical local oscillator (LO) based transmitter solutions. This is because the switching time of the LO-based transmitter is often determined by the LO channel switching time under the control of the loop bandwidth of the frequency synthesizer, around 1 MHz. Hence, the achievable channel switching time is around several microseconds, which unfortunately is too long for an agile radio. A fully digital PWM based multi-standard transmitter, known in the art, suffers from high distortion, and the channel switching time is still determined by the LO at the carrier frequency. A DDS can be used as the LO sourced to enhance the switching speed, however, this design consumes significant power and may not deliver a high frequency LO with low spurious components. Alternately, single sideband mixers can be used to generate a number of LOs with different center frequencies using a common phase-lock loop (PLL), whose channel switching times can be fast. However, this approach can only support a limited number of LO options and any additional channels to cover the wide range of the anticipated 4G bands would need extra mixtures. As discussed, sigma-delta modulators have been proposed in the art to serve as an RF transmitter to overcome these issues. However, in the basic architecture, a sigma-delta modulator cannot provide a very high dynamic range in a wideband of operations due to a moderate clock frequency. It is precisely because the clock frequency is constrained by current technology that this high frequency mode of operations cannot be supported.

FIG. 9 is a schematic block diagram 200 of a portion of the transmitter module 48 showing the delta-sigma modulator 182, the DWA circuit 184 and the DAC 188. The DWA circuit 184 modulates the digital thermal codes to shape out voltage and timing mismatches among DAC weighting elements 202 that are controlled by a shape controller 204. The weighted digital bits are then provided to the DAC 188 that generates the analog signal to be transmitted.

The delta-sigma modulator 182 employed as an RF transmitter provides digital data that can be generated by a high speed processor or can be produced by a multi-rate digital signal processor. The interleaving architecture effectively increases the clock rate of the delta-sigma modulator, boosts the oversampling ratio, and in turn improves the achievable signal-to-noise ratio and dynamic range. In order to enable this interleaving architecture, an interleaving dynamic element matching (DEM) algorithm must be employed. Unlike conventional DEM algorithms that arrange the cells in one DAC, the interleaving DEM algorithm considers the used cells in all of the interleaving DACs, and arranges them to ensure there is no periodic pattern when using the cell.

Figure 10:
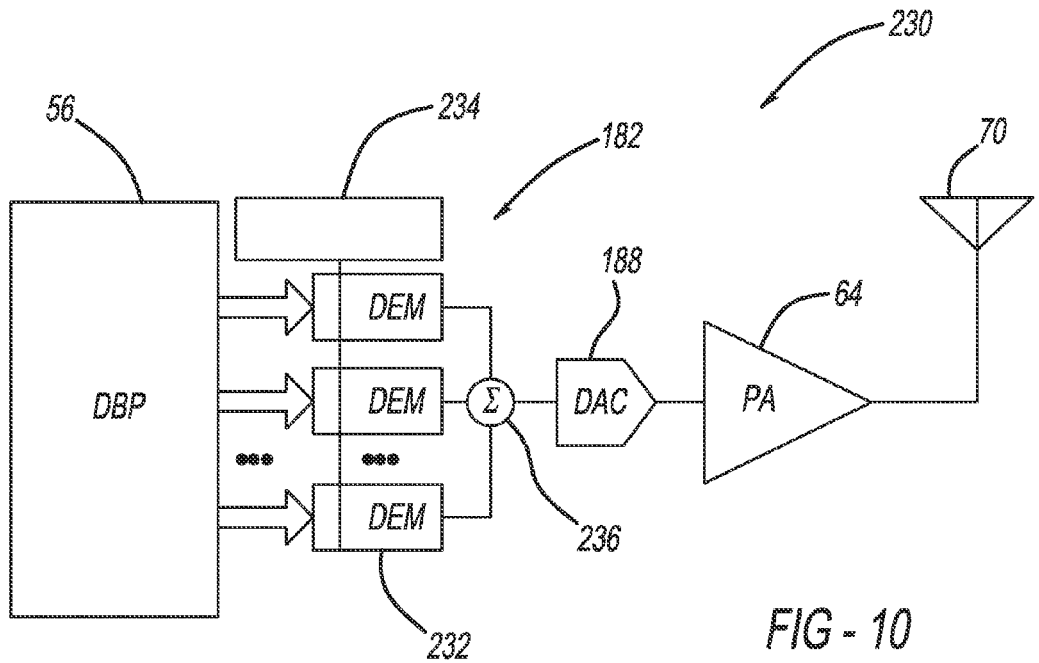
FIGS. 10-12 show three embodiments of a delta-sigma modulator employing an interleaving DEM algorithm for the transmitter module shown in FIGS. 3 and 8.

FIG. 10 is a schematic block diagram 230 of a portion of the transmitter module 48 showing the delta-sigma modulator 182, the DAC 188, and the power amplifier 64 illustrating an interleaving architecture. The DWA circuit 184 is not shown for clarity purposes. The digital signal to be transmitted from the baseband processor 56 is provided to a number of DEM circuits 232 in the delta-sigma modulator 182 to provide the dynamic element matching control provided by an interleaving control processor 234 at the slower clock rate. The signals are combined by a summer 236 and sent to the DAC 188 and then to the power amplifier 64. The DEM algorithm operating in the circuits 232 does not run at the highest clock rate, but instead the computation is distributed into the multiple circuits 232 running at a slower clock rate. The digital data is then multiplexed into one high speed data stream and fed into high speed data followed by the power amplifier 64.

Figure 11:
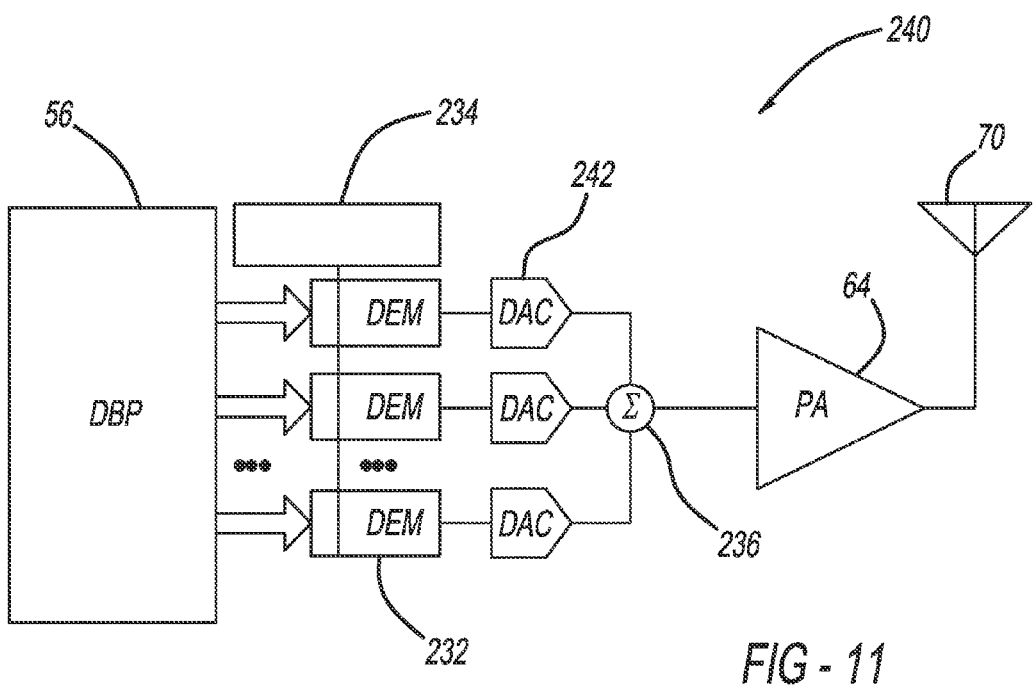

FIG. 11 is a schematic block diagram 240 of a portion of the transmitter module 48 that can replace the block diagram 230, where like elements are identified by the same reference number. In this design, three separate DACs 242, one for each of the DEM circuits 232, replace the DAC 188, where the summation junction 236 is provided after the DACs 242.

Figure 12:
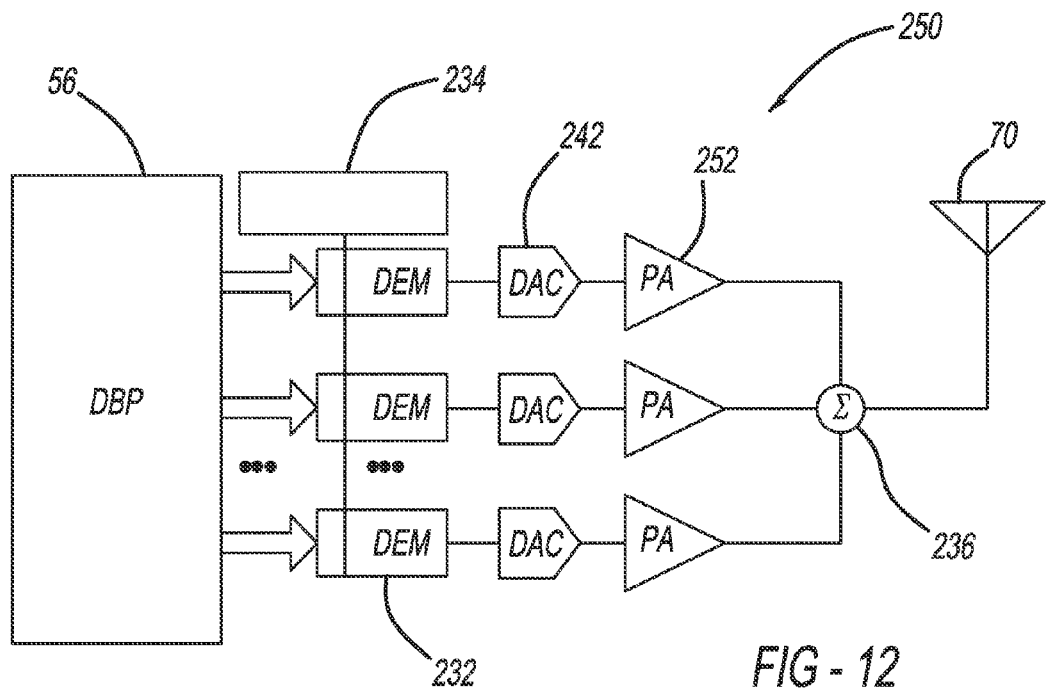

FIG. 12 is a schematic block diagram 250 of a portion of the transmitter module 48 that can replace the block diagram 240, where like elements are identified by the same reference number. In this design, three separate power amplifiers 292, one for each of the DEM circuits 232, replace the power amplifier 64.

The architecture 30 is designed to achieve 100 dB of dynamic range over 20 MHz signal band and RF carrier frequencies up to 2.6 GHz. The modulators 52 must be capable of detecting a small desired signal, such as −86 dBm, in the presence of a large unwanted interference signal, such as 14 dBm. However, when the operating scenario does not demand as much from the hardware, i.e., smaller signal bandwidths, the power dissipation in the transmitter module 48 should be reduced. There are two primary approaches for adjusting power dissipation including reducing functionality or reducing performance. Reducing functionality is a matter of reconfiguring the architecture to bypass or disable unneeded circuitry. Reducing performance includes modifying the architecture 30 to operate with decreased supply current or voltage thereby trading off performance for power. As will be discussed below, the present invention proposes several techniques in both of these categories that may be used to reduce power in the software-programmable cellular radio as discussed herein.

A first power reduction technique includes reducing the order of the filter 74 in situations where full dynamic range is not required. Particularly, the sixth-order LC filter 74 can be reduced to a fourth-order or a second-order filter by powering down following resonator stages. For example, by disabling the last group of the resonator circuit 120, the amplifier 126 and the integrator circuit 128, represented by dotted box 228 in FIG. 5, would reduce the filter 74 from a sixth-order filter to a fourth-order filter. A separate power supply may be used to completely shut down some circuitry while other circuitry could remain on, but at minimal power consumption.

A second power reduction technique is to reduce the bit resolution of the quantizer circuit 100 from 4-bits to one bit. For this power reduction technique, only one of the bits in the 4-bit quantizer circuit 100 is employed to reduce power. For example, a center one of the comparators 102 in the circuit 100 determines the zero cross-over point and is required for the one-bit operation. All of the other comparators 102 and most of the latches 104 and 110 may be turned off. All of the DAC current switches must remain active and be driven by the most significant bit (MSB) path to keep the modulator stable. For the 1-bit, 3-bit or the 4-bit operation, the tail currents in the switches may be decreased when the receive signal is not large, such as when the radio is not transmitting.

Varying the clock rate to reduce static power dissipation is another proposed technique to reduce power consumption. The impact on the delta-sigma ADC architecture for this technique includes that at a slower clock rate the quantizer circuits do not need to be interleaved, and fewer stages of de-multiplexing is required. The only reason interleaving is provided is to support fast sampling rates for high RF carrier frequencies. At lower RF carrier frequencies, the clock rate may be reduced and the interleaved quantizers disabled. If the clock rate is sufficiently slow, a one-to-two (1×2) demultiplexer may be all that is needed to interface with the DSP 54 as will be described below.

Figure 13:
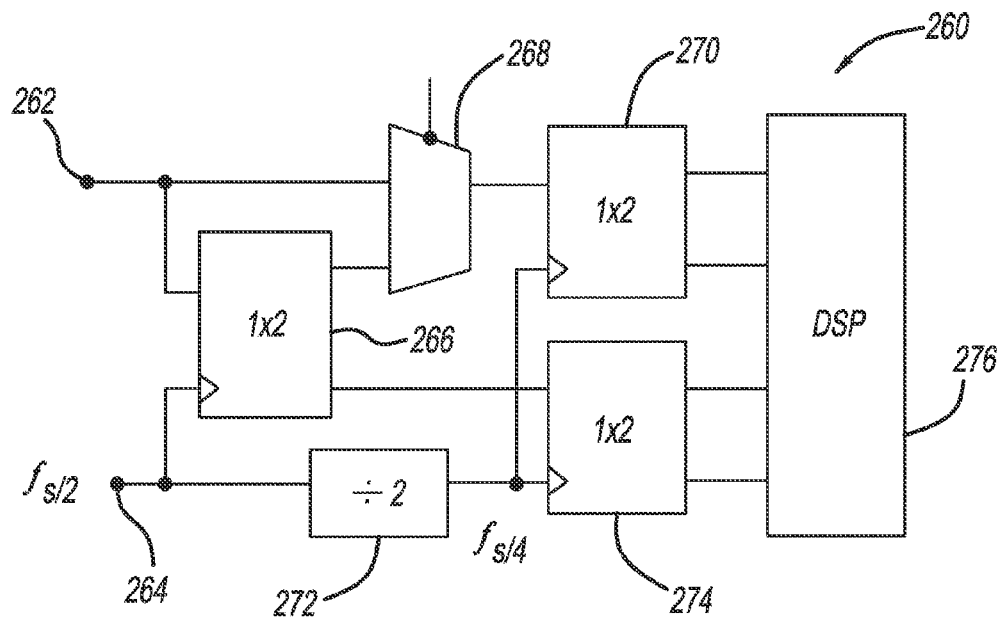
FIG. 13 is a schematic diagram of a timing circuit that can be employed in the delta-sigma modulator shown in FIGS. 3 and 8.

FIG. 13 is a schematic block diagram of a 1×4 demultiplexer circuit 260 that can be reconfigured as a 1×2 demultiplexer circuit to reduce power dissipation for slower clock rate operation in the manner discussed herein. The demultiplexer circuit 260 receives the data to be clocked in at node 262 and a one-half divided clock signal at node 264. The data is provided to a 1×2 demultiplexer 266 and a selector 268, where the demultiplexer 266 is clocked at the one-half clock signal. The selector 268 selects the normal data at the node 264 or the demultiplexed data from the demultiplexer 266, and outputs the selected data to a 1×2 demultiplexer 270. The one-half clock signal at the node 264 is divided by two by a divider 272 to generate a one-fourth clock signal that clocks the demultiplexer 270 and a demultiplexer 274. Outputs from the demultiplexers 270 and 274 are provided to a DSP 276. When the normal data is selected, the demultiplexers 266 and 274 need not be powered.

In other power-saving techniques, the present invention proposes trading performance for power consumption in relaxed operation scenarios. As an example, in a maximum performance mode the intercept point of the LNTA 72 has about a 25 dBm to support 100 dB of dynamic range while achieving a low-noise figure. If the constraint on linearity or noise can be eased, then a substantial amount of power can be saved. Two scenarios are considered to accomplish this. In the first scenario, the receive signal is well above the noise floor and the required dynamic range is less. In the second scenario, there is no unwanted transmitted signal so the maximum expected input level will be lower. In both scenarios there is a relief in design for a high third-order intercept point that can be translated to reduced current, supply voltage or both.

Performance may also be traded for power savings in the DACs 78 or 214. Since errors in the DACs 78 or 214 are not shaped by the filter 74, the DAC performance must equal or exceed the modulator performance. To achieve this performance, dynamic element matching provided by the DEM circuits 232 is incorporated in the DAC design as discussed above. Mismatches among nominally identical circuit elements inevitably introduced during circuit fabrication cause non-linear distortion. By scrambling the usage pattern of the elements, the DEM circuits 232 cause the error resulting from the mismatches to be pseudo-random noise that is uncorrelated with the input sequence instead of non-linear distortion. If operation conditions require less dynamic range, a lower-power simplified scrambler would be sufficient.

Another proposed method for programmable power efficiency in the radio architecture 30 includes disabling the transmit cancellation scheme. The cancellation scheme is implemented in part by the DAC 80 for reducing self-interference. Cancellation is only necessary if the transmit signal is in an adjacent band, is at full output power, and the reflection from the antenna structure 32 is poor. Under these conditions, there must be cancellation so that the modulator 52 can linearly process this unwanted interference as it appears at the receiver module 46 so that the DSP 54 can process it further. The delta-sigma modulator 52 may be programmed to employ any combinations of the techniques for optimizing power efficiency in the transmitter of an automotive wireless cellular communications system. An important scenario is when the transceiver module 44 is in an idle state and all of the power-saving techniques are in effect. In such a scenario, the delta-sigma modulator 52 will require only minimal functionality.

Although the RF industry has rapidly progressed with regard to compact radio architectures, existing front-end components, such as power amplifiers, low noise amplifiers and filters still limit the bandwidth in dynamic range of these components. A single RF front-end capable of wide bandwidth sampling has been contemplated before, but the device technology was not sufficiently developed to allow the design and integration of a multi-function radio that would be suitable as a cellular handset. As discussed, an integrated front-end RF module would need 111-125 dB of dynamic range for 20 MHz of signal bandwidth. CMOS cannot come close to this requirement and is moving in the wrong direction. GaAs technology is getting closer, but still falls short.

To overcome these limitations, the present invention leverages three unique innovations as discussed above, namely, an inherently wideband architecture with direct sampling using delta-sigma modulators, highly linear based power amplifiers and input transconductor amplifiers, and tunable/programmable filters. Based on these innovations, some of the components of the architecture 30 will be fabricated in silicon germanium (SiGe) technologies to provide the desired performance and power handling and some of the components will be fabricated in the CMOS technology, which is lower cost. It is noted that other semiconductor material technologies may be applicable, such as indium phosphide technologies (InP). The present invention proposes that the low-power delta-sigma modulators 52 incorporate a SiGe design and fabrication processes and provide 200 GHz FMAX that provides sufficient head room to enable new feedback linearization techniques. Further, on the transmitter side, SiGe provides system design flexibility over other technologies. The proposed software defined front-end transceiver module 44 is enabled by tightly integrating SiGe technology with silicon (Si) CMOS. Generally, those devices, components and devices that operate at the higher frequencies, such as 5.2 GHz, including the combiner 70, the LNTA 72, the filter 74, the tunable band-pass filter 60, etc., employ the SiGe technology and the components and devices that operate at the lower frequency, such as 1.3 GHz, employ the CMOS technology.

The modulators 52 will predominately be implemented in SiGe technology where it is necessary to meet the challenging dynamic range requirements across a signal bandwidth of 20 MHz at frequencies up to 2.6 GHz. Backend processing of the receive data in the DSP 54 will be implemented in 40/45 nm CMOS. A combination of SiGe and 40/45 nm CMOS will be used in the transmitter module 48. The SiGe supports broader frequency tuning and offers higher gain for improved linearity. The DWA circuit 184 and the transmit DAC 188 will be implemented in 45 nm CMOS for highest power efficiency.

In one implementation, CMOS technology is employed to realize the data modulation, dynamic element matching algorithms, and fabrication of the DACs to achieve a low power realization. SiGe technology is implemented in the receiver modulator filters and the transmitter tunable band-pass filter 60 for high speed operation. An enabling technology to allow the integration of the SiGe fabrication techniques and the 40/45 nm CMOS fabrication techniques is referred to as micro-bump integration technology. The interleaving sigma-delta modulators can use the micro-bump technology discussed below. Separate circuit fabrication can proceed in parallel without modification and then tightly integrated with an integration technology for low parasitic performance.

Figure 14:
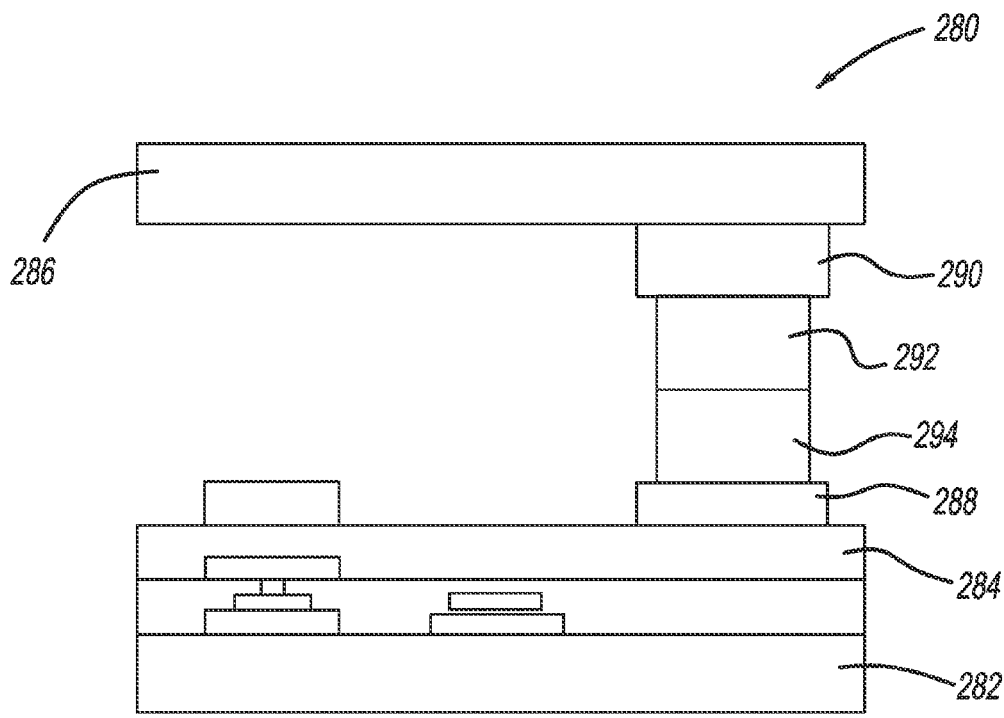
FIG. 14 is a profile view of a semiconductor device showing integration between CMOS and SiGe technologies FIGS. 15 A & B are schematic diagrams of a portion of a transceiver circuit including a gm-array of FETs used for circuit connectivity and control.

FIG. 14 is a profile view of a semiconductor device 280 showing integration between SiGe and advanced CMOS technologies through a known micro-bump integration technique. The device 280 includes an SiGe substrate 282 on which is deposited SiGe device layers 284 and a CMOS substrate 286. A metal contact layer 288 is deposited on the device layers 284 and a metal contact layer 290 is deposited on the CMOS substrate 286. The substrates 282 and 286 are integrated together through a micro-bump 10 μm I/O pad layers 292 and 294 having a 20 μm pad pitch.

Proposed below is a new method of using reconfigurable field programmable analog arrays (FPAA) of gm-cells. FPAA provide a digitally controlled method to adaptively connect various analog cells, with a transconductance, thus enabling flexible circuit configurations. Details are provided for a technique of using a FPAA of gm-cells in a Delta-Sigma (DS or $\Delta\Sigma$) or Sigma-Delta (SD or $\Sigma\Delta$) circuit to assess, and then adjust, the architecture for adaptive operation. As used here, a gm-array is an array of electronic components ("gm cells") employed for their transconductance (commonly identified as "$g_m$") properties. In particular, examples are shown where the device includes an array of field effect transistors (FETs) and the transconductance is the ratio of the drain current to the gate voltage. With the proposed invention, the transceiver in an automotive wireless cellular communication system, or other dynamic signal environment, can be reconfigured for evolving communication standards or changes in power profiles and have optimized performances at all operational scenarios.

Traditionally the SD modulators are designed with a fixed architecture (i.e. the order, the number of quantizer bits, etc.) while the filter coefficients can be changed to move the center frequency and vary the signal bandwidth. The innovation described here offers a way to reconfigure the architecture and optimize the coefficients for the new architecture. The invention leverages an array of analog gm-cells analogous to memory core in the digital world. The array of analog cells can be selectively activated or deactivated thus enable extreme flexibility in an adaptive, real time manner. Dynamic reconfiguring of the array enable the following capabilities: the filter order can be changed, compensations paths can be created (e.g for better stability), and signal paths can be disabled to allow system calibration in an open-loop condition.

Programmable arrays such as SRAM and FPGAs have been used for some time in digital systems. More recently, programmable analog arrays are being used for rapid prototyping of analog functions. It is also known in the art to use an array of operational transconductance amplifiers (OTAs) to create the integrators and active resonators in a SD modulator. The innovation disclosed herein extends this idea to passive inductor-capacitor (LC) architectures and introduces the concept of using the array for calibration in addition to architecture reconfiguration.

The extension of using a reconfigurable gm-array for calibration is not obvious. Inspiration comes from applications where the SD architecture in the transceiver must adapt to meet extremely stringent performance specifications in one scenario and require ultra-low power in another, such as with cellular or mobile devices.

A generic continuous time SD modulator 300 is shown in FIG. 15A and is redrawn as SD modulator 310 with an array of gm cells 312 in FIG. 15B. By deactivating some of the gm cells 312, the architecture may be configured as a cascade-of-integrators, feedback form (CIFB) or as cascade-of-integrators, feed-forward form (CIFF). The architecture can also be collapsed into a lower order filter by deactivating selected gm cells 312. These features are discussed below. Elements of the SD modulator 310 in FIG. 15B can be used as building blocks for the delta-sigma modulator 52 in FIG. 3.

For ease of explanation, a less complex modulator will be used to explain the core idea of the invention. A 4th order SD modulator 320 is shown in FIGS. 16 A/B, where FIG. 16B shows the topology of the modulator 320 and FIG. 16A shows the modulator 320 implemented with a gm-array. In the SD modulator 320, some elements correspond to elements shown in FIG. 3 (described previously), including the modulator 52 (as mentioned above), and DSP 326 corresponds to the DSP 54. The array of gm cells 332 is controlled by a coefficient logic function controller 334 which can assign negative, zero, or positive transconductance values to the gm cells 332. When a gm cell has a zero-transconductance value, the cell is deactivated or open. The bias current for all gm cells is controlled by a current source routing network 336 used to optimize power dissipation while maintaining common mode voltages. In this manner, the modulator 320 is independent of the array configuration.

Figures 17A, 17B:
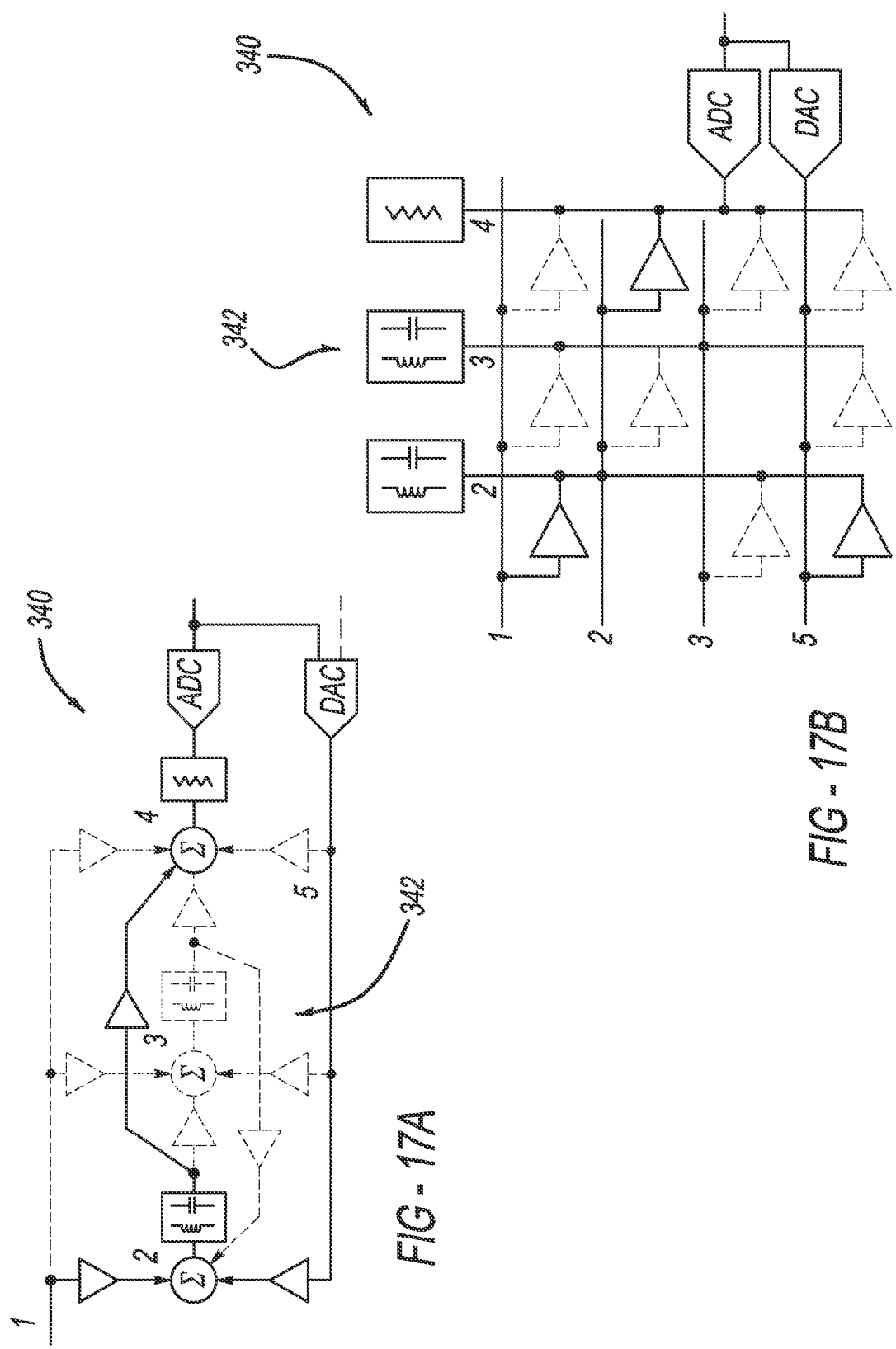
FIGS. 17 A & B are schematic diagrams of the fourth order sigma-delta modulator of FIG. 16 reduced to second order via operation of the gm-array.

Two examples of how the 4th order modulator 320 shown in FIGS. 16 A/B can be reconfigured for different operations are now discussed. The first example illustrates how the gm-array can be used to optimize power dissipation by reducing the architecture complexity during scenarios where the transceiver does not require high dynamic range performance. As shown In FIGS. 17 A/B, the 4th order modulator 320 of FIGS. 16 A/B is reduced to a 2nd order modulator 340 by bypassing a second resonator node 342. The gm cells shown in dashed lines will have zero-transconductance and the active gm cells (solid lines) will have different coefficient values for the new filter order.

The second example, embodied in an SD modulator 350, illustrates how the reconfigurable gm-array can be used to optimize dynamic range for variable environmental conditions and is shown in FIGS. 18 A/B. As the transceiver changes its environment, say for example the temperature increases, the circuit component characteristics will change. During non-receive mode, a training code can be applied to a DAC and the output of an ADC 354 evaluated. During this operation, a number of gm cells 356 can be deactivated, as indicated by the dashed lines. The quantified delay—also known as the excess phase delay—can be used to recalculate the coefficients and optimize the performance. Many other calibration configurations can be used to quantify individual circuit components.

Referring back to FIGS. 16 A/B, the discussion now focuses on the current source routing network 336 which controls the dc currents in the gm-array. In all active gm-cells 332, the dc current must be sufficient to maintain linearity for all signal levels. Traditionally, the modulator 320 is designed for the most challenging conditions, for example during operation at the lower frequencies of the RF band when the gm coefficient values are the highest, and in all other conditions the dc current is in excess. The proposed invention incorporates smart-dc operation by redirecting unit dc current sources to gm cells with higher transconductance values. This feature is particularly important when the array configuration changes and the dc current into the deactivated cell is wasted.

Figure 19B:
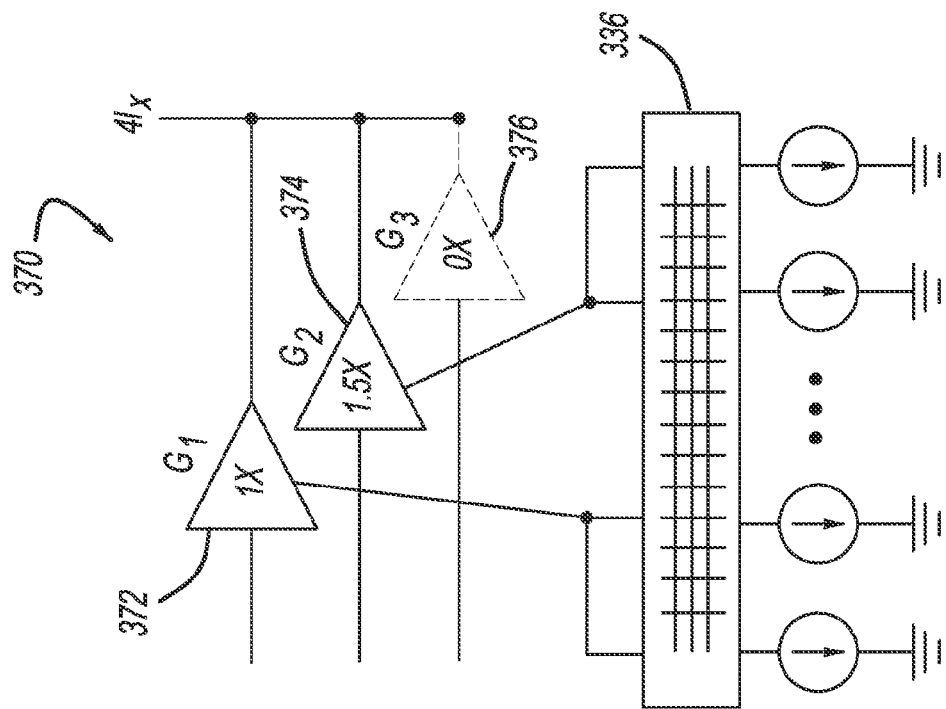
FIGS. 19 A & B are schematic diagrams of a portion of a sigma-delta modulator circuit where a current controller redirects current from inactive gm-cells to active cells in order to optimize power consumption.
Figure 19A:
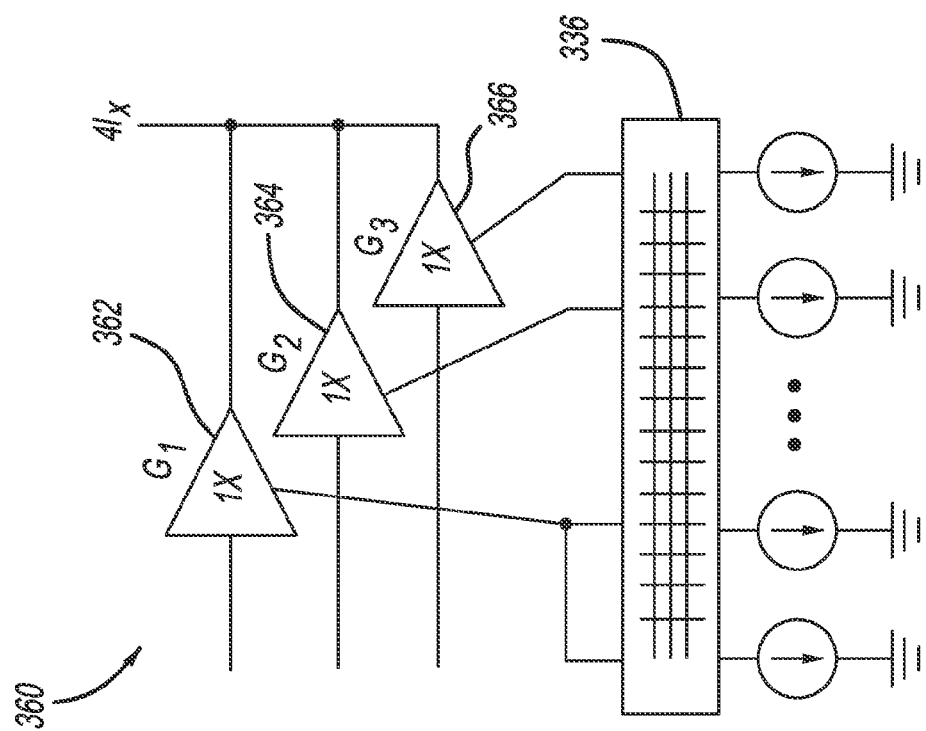

An example of the above is shown in FIGS. 19 A/B. In a configuration 360 in FIG. 19A, all gm cells 362-366 are active and the dc current from the current source routing network 336 is sufficient to provide linear operation. In a configuration 370 in FIG. 19B, the array is reconfigured with gm cell 376 (G3) deactivated and the coefficient value of gm cell 374 (G2) is 1.5× its original value. The unit dc current source from G3 has been re-directed to support the higher transconductance value of G2. The redirection of the current keeps the output common mode voltage into the quantizer constant. In this example the dc power does not change however a more sophisticated network can be designed to work with selectable load impedances to reduce dc power without affecting the common mode voltage.

Also proposed herein is a novel digital method that will correct and reduce distortion in the Power Amplifiers (PA) used in the transmitter chain. The method will further improve the dynamic range and linearity of the PA. Power amplifiers are typically used for amplifying and transmitting communication waveforms in the radio frequency front-end of cellular network system but our disclosure is not restricted to this application. The target applications are broadband Power Amplifiers but where only a small fraction of the bandwidth is used at any given time. The method is independent of modulation scheme used for the particular waveform of interest.

The software/PA driver proposed here is a small, inexpensive, low-power communication device capable of handling multiple communication standards and has been designed to offer precisely these benefits.

Traditionally, for cellular telephony, different modes and bands of operations have been supported in hardware by having essentially multiple disparate radio front-ends and baseband processing chips integrated into one platform (e.g. tri-band or quad-band user handsets supporting GSM, GPRS, etc.), as discussed previously relative to FIG. 1.

Note that this static architecture of FIG. 1 is critically dependent on narrow-band filters, duplexers as well as standards-specific down-conversion to IF stage. The main disadvantage of this static, channelized approach is it's inflexibility with regards to changing standards and modes of operation for mobile communication devices. As the cellular communication industry has evolved from 2G to 3G and 4G and beyond, each evolving waveform and mode has required a redesign of the RF front-end as well as expanding the baseband chipset capability—thus necessitating a new handset. For the automotive application, and other applications with long lifespans, this inflexibility to support emerging uses is prohibitively expensive and a nuisance to the end-user. The architecture proposed here would overcome this limitation by doing away with static filters, duplexer technology and instead using a wideband sampling capability akin to software-defined radios and yet provide the high dynamic range, sensitivity and optimized performance that is needed for modern communication systems such as 4G and beyond end-user terminals.

Prior-art in such software-defined radio architecture has been proposed and pursued in nonautomotive applications, but a zero-IF approach has proved technically difficult. Prior-art with software defined radios have typically focused on seamless baseband operations to support multiple waveforms and have assumed simpler down-conversion-to-baseband specifications. For the transmitter side, parallel power amplifier chains for differing frequency bands have typically been used for supporting different waveforms standards. The approach taken in the current disclosure will replace the multiple power amplifiers with a single one.

Figure 20:
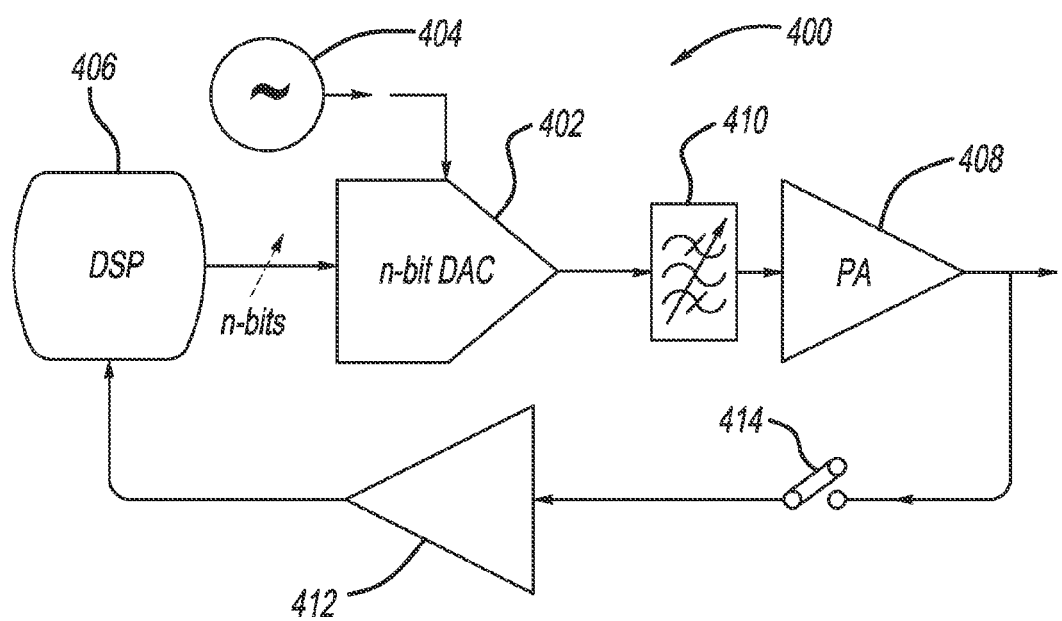
FIG. 20 is a schematic diagram of a portion of a transmitter circuit including a calibration feedback loop from power amplifier output back to a digital signal processor.

A possible embodiment of the invention is shown as circuit 400 in FIG. 20. For this example, a 4 bit DAC 402 is running at a 5 GHz sample rate provided by clock 404. The modulated signal data for the DAC 402 is synthesized by a Digital Signal Processor (DSP) 406 and sent to the DAC 402 at a 5 GHz rate. The bandwidth of the signal can vary, for example from 20 MHz to over 100 MHz. The ratio of sampling clock frequency (5 GHz) to information bandwidth results in a signal that is oversampled, in this particular case by a factor of greater than 50 times. Since PAs vary in performance due to process variations, the DSP 406 will need to run a calibration cycle to determine the proper coefficients needed. An additional advantage of this calibration process is that depending where the samples are taken it can remove nonlinearities beyond the power amplifiers, for example, to include the signal path from the PA 64 to the antenna 32 in FIG. 2.

In the circuit 400, the DSP 406 (Modulator/Noise Shaper/Pre-Distorter) is a fully digital CMOS circuit customized with a high-speed output interface. The DSP 406 will perform two very important but independent functions: (1) Noise-Shape the output of the DAC 402—it will remove the quantization noise in the immediate vicinity of the signal thus improving the dynamic range and signal-to-noise (SNR); and (2) it will generate data that is pre distorted to compensate for the non-linearity of the amplifier—in this case PA 408.

The second key element is a tracking tunable band pass filter 410. The filter 410 will remove any noise and signals outside the band of interest. This device can be an active or passive device. For simplicity and ease of configuration, it is suggested that an active band pass filter be used. By using direct RF conversion, additional non-linearities and frequency (filter) restrictions of an up-converter (mixer) system are avoided, thus enabling a compact single solution. Note that this improves upon current cellular systems that use multiple mixing stages to cover different bands. This proposed filtering technique and associated DSP software is a compact, inexpensive solution, and well suited for low-power communication devices capable of handling multiple communication standards.

The circuit 400, for example only, assumes a 4 bit DAC 402, 5 GHz clock 404, and an active, tunable, Band pass filter 410, where both the center frequency and bandwidth are adjustable. The DSP 406 is a CMOS digital block that generates a 5 GHz 4 bit data stream into a 16 bit thermo code that drives the DAC 402. As discussed above, the DSP 406 pre-distorts the input signal to compensate for the PA non-linearities (and/or additional non-linearities due to downstream components, e.g. the antenna). The PA nonlinearities can be fully characterized by running a calibration sequence, where a calibration feedback element 412 provides feedback to the DSP 406 upon closing of a switch 414. This calibration sequence could be a part of the initial power-on sequence for the device. In this embodiment, the DSP 406 also implements an Infinite Impulse Response (IIR) algorithm to lower the noise floor in the vicinity of the signal. Further, the DSP 406 can optionally implement a Dynamic Element Matching (DEM) mechanism which scrambles the thermo code output to improve the linearity of the DAC 402. The output of the DAC 402 is a differential analog signal with a significantly enhanced signal to noise ratio in the vicinity of the signal frequency (>90 dB).

The present invention further relates to the calibration of the tuning components in a radio frequency (RF) transceiver based on tunable bandpass sigma delta (i.e. zero intermediate frequency) data converters. Specifically, three issues are considered: first, the calibration and correction scheme for the resonators, filters and other analog components in the transceiver chain; second, the issue of high power mode (>0 dBm) calibration of the transmit chain; and third, the role of the precision clock source driving the timing throughout the device.

The proposed sigma-delta based transceivers are devices that have been designed to be software tunable and be able to support mobile handset-like waveforms (e.g. LTE, WCDM) and other wireless waveforms that have widely varying data reception and transmission protocols. For example, the center frequency of the carrier wave can range from below 400 MHz to over 3 GHz, and the waveform output powers can be as high as 23 dBm, while simultaneously ensuring the receiver still has ultrafine sensitivity with a dynamic range that can exceed 100 dB. For these reasons, an accurate, repeatable and adaptable calibration and correction scheme is needed to ensure the proper operation of the RF transceiver. These techniques, as they relate to receive signals, can also be used in receiving only devices, for example, TV.

A novel mechanism is proposed involving the incorporation of digital domain interference cancellation modules, high precision clocks locked to low phase noise feedback loops and low linearity switches integrated to triplexer/multiband modules to characterize the transmit, receive and feedback paths for accurate calibration and adaptive compensation of the whole transceiver.

This invention can enable calibration and correction schemes for analog and mixed signal components in a delta-sigma data conversion based RF transceiver and for receivers, for receive-only applications. By using a hybrid mixture of analog tuning components coupled with digital predistortion and calibration methods, the frequency, phase and gain accuracy of the signals being processed in the receive and transmit portions of the transceiver chain are ensured. It is vital to ensure that the parameters being used to generate/process the waveforms actually generate/process waveforms that are in strict compliance with the standards based communication protocols for which this device is designed to interface and operate with (e.g. cellular and LTE). The advantage of this approach, over what has been done previously is that it allows a system level calibration of the various components of the zero-IF receiver architecture, and takes advantage of the unique wideband data converter architecture to simplify what would otherwise be difficult individual calibration processes.

Traditionally, the transceivers that have been used for mobile communications applications have all been staged down-conversion type devices, with LO, mixers, pre-election filters, etc. to handle different communication waveforms and frequencies—as discussed previously. The calibration procedures for such architectures are well known, and essentially serve to compensate for the errors generated by the non-linear elements in the signal path, e.g. the mixer, gain blocks, etc. They also calibrate for deviations in the components due to fabrication process variations for the different analog filtering elements. The great majority of these techniques involve two approaches: a method involving the generation of known "tones" or reference signals that are then passed through the transmit and receive chain, and a corresponding measurement block (square power detector, threshold, etc.) that measures deviation from the reference parameters. This loopback method is used to set the calibration parameters of the various elements in either the transmit or the receive path of the transceiver. A modified second approach involves actually digitizing the response of the various units in the transceiver chain by utilizing the data conversion elements already present in the architecture, and then processing the error vector all in the digital domain to extract the calibration parameters. Subsequently, the transmit signal is appropriately predistorted or gain/feedback elements are reset so that the desired response is iteratively found for the RF path in question.

The approach taken in the presently disclosed invention extends beyond the traditional techniques described above, as it deals with sigma-delta architectures that operate in a bandpass mode at the RF center frequency of the carrier. Therefore, traditional issues with mixers and LO calibration are not applicable here because typical corrections for mixer distortion, I/Q mismatch, etc. that have been considered in the prior art are not applicable to the disclosed zero-IF system. Instead, frequency stability of the bandpass mode, ability to characterize the distortion for higher power operation modes, coupling behavior with the novel triplexer, or other multiband combiner, all require methods for error/drift detection, characterization and compensation on a dynamic basis not consider in other systems.

The main elements related to the invention described here are shown in the block diagram of a transceiver circuit 500 in FIG. 21. The transceiver circuit 500 of FIG. 21 corresponds to the transceiver circuit 50 of FIG. 3 discussed previously, with additions and simplifications to facilitate the present discussion of calibration. This block diagram of FIG. 21 illustrates, in general, the receiver and transmitter portions of the delta-sigma based RF transceiver 500, with the portions in blocks 502, 504, 506 and 508 specifically being relevant to an embodiment of the various calibration and correction scheme discussed further below.

So, for example, following the path of a received RF signal, the waveform impinges upon a multiband antenna module 510 and passes through an integrated switch 512 and a triplexer/multiband combiner module 514 where the signal is directed to the receiver chain for the correct frequency. The waveform then passes through another signal switch/combiner module 516 whose function is to remove any residual self-interference signal generated from the transmitter, as described previously. Next the waveform is processed in a delta sigma modulator and ND converter (receiver module) 520 where it is sampled and converted into baseband digital bits that are passed onto a digital signal processor 522 for further decoding. Note that there are no down conversion stages, or mixers or filters in the receive path as found in typical receiver chains. Thus the term "zero-IF" used for this transceiver architecture.

On the transmit side, the digital symbols to be transmitted are generated in the baseband chip (not shown) and further processed by the DSP 522, and that digital signal is passed into a delta-sigma transmitter module 530 for direct conversion to an RF waveform at the desired carrier frequency and modulation. Note that, as disclosed earlier in the relevant section of the invention disclosure, a portion of the modulated signal is used in the self-interference cancellation module 504 that subtracts any residual transmit signal leaking into the receiver chain. From the delta-sigma transmitter module 530, the signal passes to a DAC 532 for conversion to analog. From the DAC 532, the waveform is bandpass filtered using a tunable bandpass filter 534, and then power amplified in PA 536. A calibration feedback and switch module 502 is configured to calibrate for PA distortions, after which the waveform passes to the triplexer 514 and switch 512 (collectively module 506). In normal operation, the switch 512 sends the output signal to the antenna 510. However, for high power calibration mode, the switch 512 is set to not radiate any RF energy through the antenna 510 and instead the receiver path is used to calibrate the waveform parameters.

Finally module 508 is a high level representation of the timing, phase/frequency and bias setting components that will be used to calibrate and compensate multiple modules—the receive and transmit delta sigma units (520,530), the bandpass filter 534 and other feedback and clock operations controlled in conjunction with DSP operations.

The module 508 will have a surface acoustic wave (SAW) resonator, or equivalent, clock source 540 with low phase noise and jitter. Precision phase and frequency detectors will then be used as part of a low phase noise Phased Locked Loop (PLL) comparator 542 to compensate for the frequency errors for the transmit and receive sigma-delta modulators (520,530). In block 544, parameters will be extracted for the compensatory bias settings via feedback measurements as discussed below, and computed in algorithms running on the baseband DSP 522.

One such compensation is the PA distortion, accomplished via setting switch 550 in module 502 to activate a feedback loop to enable calculating predistortion values in block 552—to compensate for the PA distortion as discussed previously.

A related calibration is the high power behavior of the transmitter and the interaction with the triplexer/circulator/multiband module 514. Module 506 in this case will integrate very linear switches with the triplexer/circulator/multiband module 514 to characterize the high power path, by using the calibrated receiver path to compare against a known tone. In this calibration mode, the transmit signal follows a different path, where it passes through the module 506 and into the receiver chain (combiner/switch 516, etc.). In this configuration, which is discussed in detail below, the signal to the combiner/switch 516 does not come directly from the triplexer 514, but rather takes a different route in the module 506.

Figure 22:
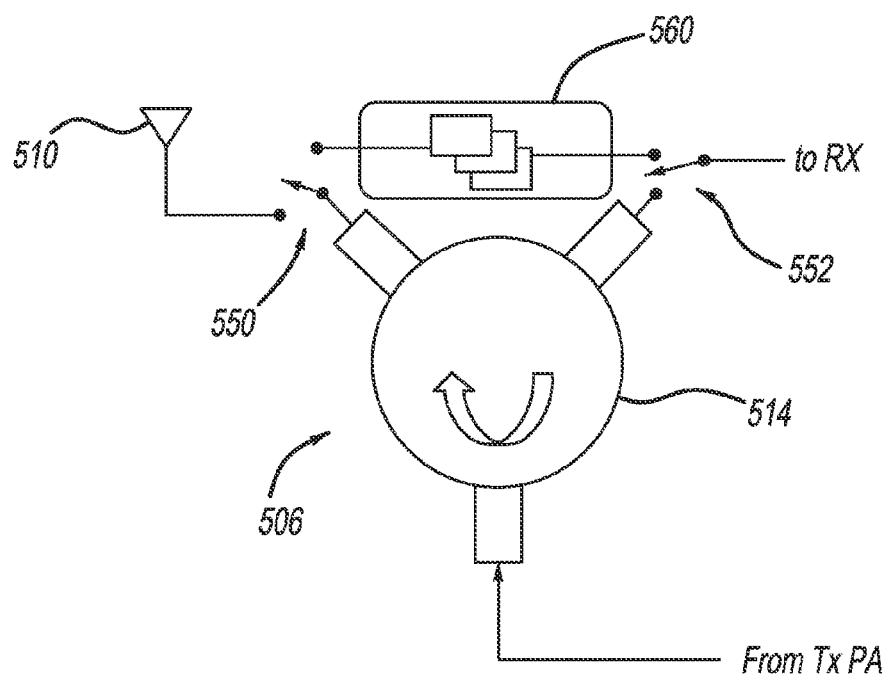
FIG. 22 is a schematic diagram of one embodiment of a triplexer/switch module from FIG. 21.

FIG. 22 is a more detailed schematic diagram of the module 506 including triplexer and switch functionality. In this arrangement, the triplexer/circulator/multiband module 514 is integrated with two switches: a first switch 550 switches the signal path from the PA 536 either to the output path to the antenna 510, or alternatively bypasses the antenna 510 and instead routes the signal into a variable load/attenuator module 560 capable of handling up to the full output power of the PA 536 (e.g. +23~+25 dBm for a typical LTE waveform). A second switch 552 enables this attenuated signal, attenuated enough to be safe for the receiver to handle, to be passed directly to the receiver path. In normal operations, the switch 552 would connect to the triplexer 514 so that the signals received at the antenna 510 would be passed onto the $\Delta\Sigma$ receiver module 520. The variable load/attenuator module 560 can be integrated in the module 506 but external to the triplexer 514, or part of the triplexer 514, or some combination thereof, depending on system efficiency, power handling and other design and packaging considerations.

The variable load/attenuator module 560 may include multiple sub-modules, each with a different level of attenuation, and each with its own signal path. The different attenuation levels in the sub-modules would be designed to accommodate different power levels of the transmit signal during calibration. For clarity, FIG. 22 shows only a single signal path through the variable load/attenuator module 560, and the switches 550 and 552 are accordingly shown as single pole double throw devices. It is to be understood that the variable load/attenuator module 560 may have multiple inputs and outputs. For example, the variable load/attenuator module 560 could be designed with three inputs and three outputs (three different signal paths through unique attenuation sub-modules), and in this case the switches 550 and 552 would be single pole quadruple throw devices.

The concept of operations for this calibration procedure is as follows. To keep radiated power within FCC or other regulatory limits and to avoid interfering with other devices, and to calibrate for the effect of various mismatched conditions that may be present for the antenna 510, the variable load and attenuation module 560 will be incorporated as a programmable/software settable module that will be used to perform this calibration. In normal operations, the output switch 550 will route transmitted RF signals from the power amplifier 536 thru the triplexer/circulator/multiband 514 directly to the antenna 510. However, for calibrating the transmitted signals in higher power settings and to account for various mismatched load settings, the switch 550 will instead be set to bypass the antenna 510 to pass the RF signal through the variable load/attenuator module 560, thus accurately replicating the mismatch conditions, and then directly on to the receiver to complete the feedback path for doing high precision calibration and compensation. In the case of calibration, the receiver port switch 552 will connect the variable load/attenuator module 560 to the receiver section to complete the feedback path, whereas in normal operation the receiver port switch 552 simply connects the antenna 510 to the receiver section via the triplexer 514. This arrangement allows for an accurate high power calibration method instead of having to look to the Tx to Rx leakage signal to use as a calibration path, since that signal itself may have frequency dependent variations.

Note that one complication which may arise is how to calibrate the receiver path independently without the effects of the transmit path being superimposed on the measurements. An innovative solution to this problem is to utilize the interference cancellation module 504 also as a calibration pathway. Since the module 504 is directly tapped off of the digital lines without going through the transmit DAC, BPF and PA chain, digital predistortion and calibration algorithms in the DSP 522 can be used to iteratively tune the receiver components (in conjunction with tones and stable reference clock signal from the module 508) to compensate for any calibration offsets.

In addition to the calibration techniques described above, this invention discloses a novel method to calibrate the receiver performance and correct for deviation/degradation of a delta-sigma data converter due to the device mismatch or process variation without injecting calibration signals or tones. Furthermore, this calibration technique does not require alteration to the signal path which current state of the art calibration methods require.

The calibration method disclosed here can reduce the implementation area of the radio-frequency (RF) and analog circuits in a delta-sigma data converter and eliminates the potential signal loss on the feedback path because the device neither needs a dedicated calibration tone generator nor has to break the feedback path when performing the calibration for the delta-sigma data converter. This calibration method provides a robust and scalable calibration mechanism for delta-sigma data converters and delta-sigma data converter-based radio receivers. While the embodiment shown below is for a cellular transceiver, the method can be applied to any sigma delta receiver.

Transceiver systems known in the art utilize a calibration-tone injection methodology for receiver calibration. A major disadvantage of calibration-tone systems is that they require extra resources, including computational resources and power consumption, on the circuit to generate the tone. Other known prior art systems utilize an additional switch in the feedback loop. The disadvantage of switched feedback loop systems, in addition to requiring the additional switch, is that the additional switch results in signal loss and degradation on the feedback path.

Figure 23:
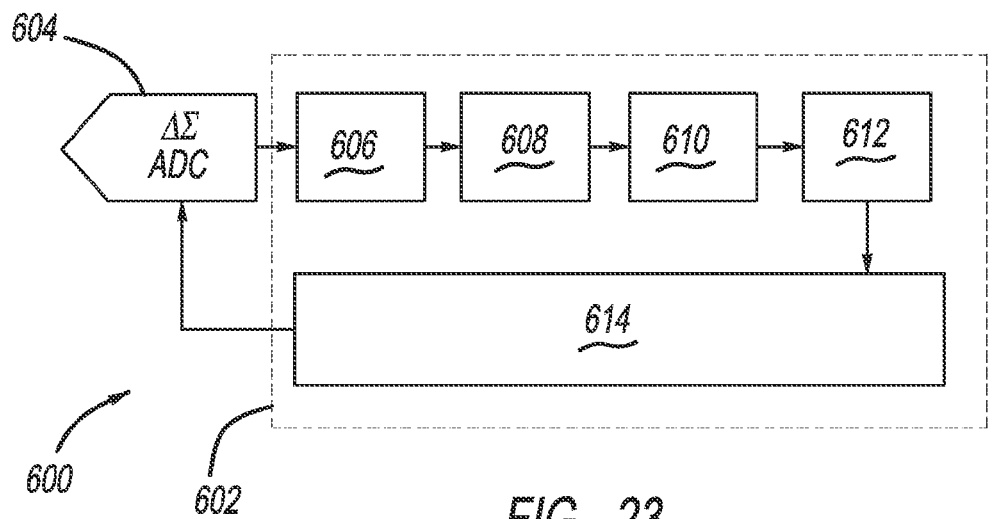
FIG. 23 is a block diagram of a calculation technique which can be performed by a digital signal processor to calibrate a sigma-delta ADC in a receiver without the use of testing-tone injection.

FIG. 23 is a block diagram 600 showing a calibration mechanism requiring no calibration tone injection. No additional components are required in the signal path, thus eliminating potential issues seen in prior art systems. The disclosed tone-free calibration leverages existing resources in the receiver chain—specifically a DSP 602, which can be incorporated into the DSP 54 of FIG. 2, and a $\Delta\Sigma$ ADC 604—which may correspond to the $\Delta\Sigma$ ADC 52 of FIG. 2. The DSP 602 is configured to perform the following operations, in sequence: a Fast-Fourier transformer (FFT) 606, a moving average (MAV) 608, a differentiator (DIFF) 610, a minimum finder (MIN FIND) 612, and a Least-Minimum-Square (LMS)/gradient descent adaptive control 614. Some of the operations listed above are reused from other functions such as demodulation of OFDM signals.

Figure 24:
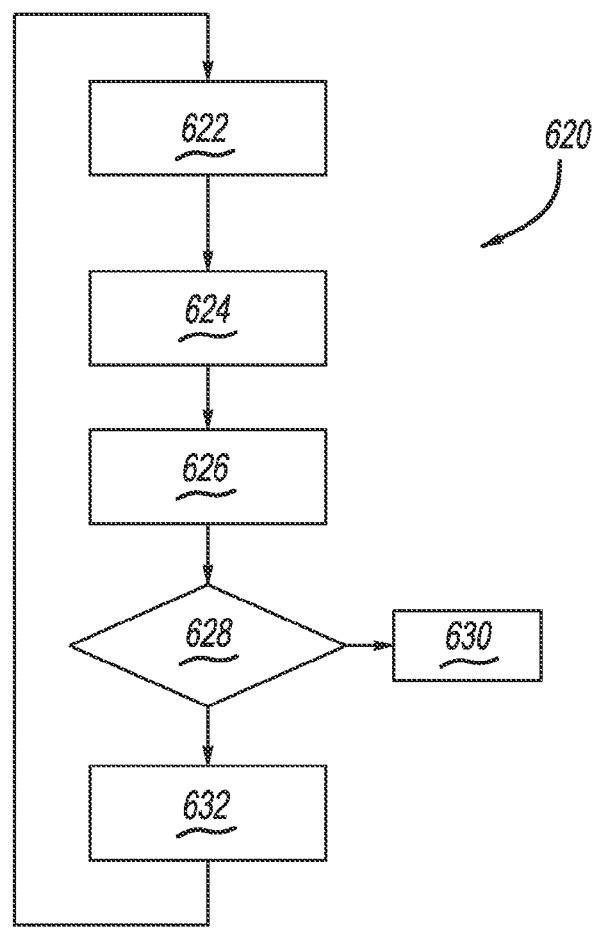
FIG. 24 is a flowchart diagram of a method used in the calibration calculation of FIG. 23.
Figure 25A:
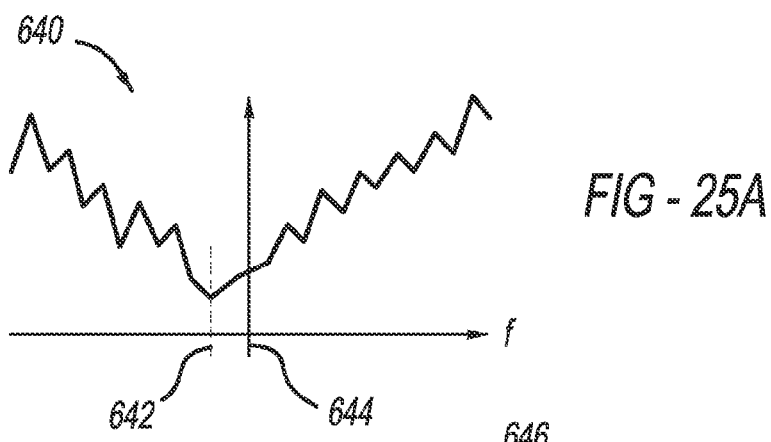
FIGS. 25 A-D are graphs illustrating the characteristic shapes of the outputs of the calculation modules in the block diagram of FIG. 23.
Figure 25B:
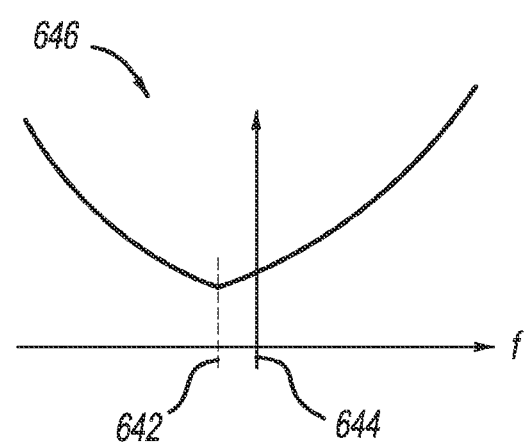
Figure 25C:
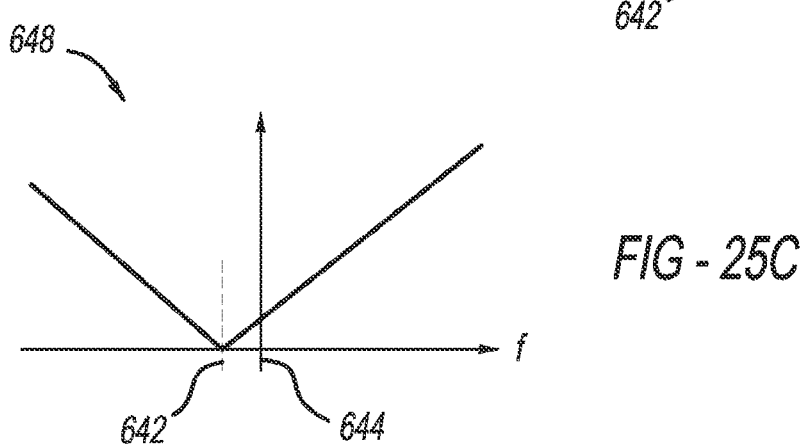
Figure 25D:
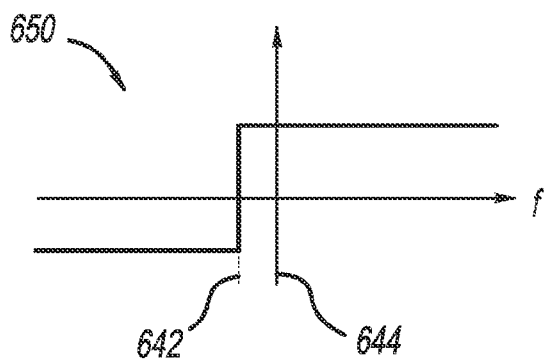

FIG. 24 is a flow chart diagram 620 depicting a method of the operation of the invented device. FIGS. 25A-D are graph diagrams showing characteristic shapes of the signal outputs from the modules 606-612. At box 622, the FFT module 606 constructs a frequency spectrum of the ADC output signal using a Fast-Fourier transform technique. The characteristic shape of the output of the FFT module 606 is shown on graph 640, where the sawtooth-shaped curve represents signal amplitude on the vertical axis plotted against frequency on the horizontal axis. Frequency value 642 indicates an approximate center of the "notch" in the frequency response plot, while a frequency value 644 indicates a desired notch center frequency.

At box 624, the MAV module 608 smooths the frequency spectrum of the ADC output signal by applying a moving average to the FFT output. The characteristic shape of the output of the MAV module 608 is shown on graph 646, where the sawtooth-shaped frequency response curve has been smoothed to a much simpler shape with a better-defined notch minimum. At box 626, the DIFF module 610 differentiates the moving average frequency response curve. The output of the DIFF module 610 is shown on graph 648, where the vertical axis now represents slope of the frequency response differential.

At decision diamond 628, the MIN FIND module 612 converts the data from the graph 648 into a simple positive 1 or negative 1 value, shown on graph 650, where the vertical axis now represents the sign of the previously-calculated slope value, and all slopes above the frequency 642 have a positive sign and all slopes below the frequency 642 have a negative sign. At the decision diamond 628, the location of the frequency 642 (actual notch center) with respect to the frequency 644 (desired notch center) is checked to determine if the frequency difference meets system specifications. If so, then the ADC 604 does not need calibration, and the process ends at box 630. If the frequency difference does not meet specification, then the Least-Minimum-Square (LMS)/gradient descent adaptive control module 614 provides calibration signals to the ADC 604. Calibration continues to ensure the ADC 604 remains within specification.

In summary, the digital signal processing techniques of the modules 606-612 analyze the notch characteristics of the ADC frequency response, and adjust the circuit parameters of the ADC 604 as needed to produce a notch at the desired frequency. This calibration is performed using existing receiver hardware, and without testing tone injection, providing the benefits discussed above. After calibration, the receiver will have a maximum signal noise ratio (SNR) at the desired frequency due to the notch produced during this calibration process.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An RF transmitter module for a cellular radio, said transmitter module comprising:
    a delta-sigma modulator including a plurality of interleaving dynamic element matching (DEM) circuits providing interleaved digital bits at a reduced clock rate;
    an interleaver controller for controlling the DEM circuits so as to provide groups of the digital bits at different points in time;
    at least one digital-to-analog converter (DAC) for converting the interleaved digital bits to an analog signal;
    a tunable bandpass filter for removing out-of-band signals from the analog signal; and
    at least one power amplifier for amplifying the analog signal.

2. The transmitter module according to claim 1 wherein a separate DEM circuit is provided for each bit of the DAC.

3. The transmitter module according to claim 1 wherein the DACs are fabricated in silicon germanium (SiGe) heterojunction bipolar transistor (HBT) technologies.

4. The transmitter module according to claim 1 wherein the power amplifier is fabricated in silicon germanium (SiGe) heterojunction bipolar transistor (HBT) and gallium nitride (GaN) high electron mobility transistor (HEMT) technologies.

5. The transmitter module according to claim 1 wherein the cellular radio is a vehicle cellular radio.

6. An RF transmitter module for a cellular radio, said transmitter module comprising:
    a delta-sigma modulator including a plurality of interleaving dynamic element matching (DEM) circuits providing interleaved digital bits at a reduced clock rate;
    an interleaver controller for controlling the DEM circuits so as to provide groups of the digital bits at different points in time;
    a summation junction adding the groups of the digital bits to provide a continuous stream of the interleaved digital bits;
    a digital-to-analog converter (DAC) for converting the stream of interleaved digital bits to an analog signal;
    a tunable bandpass filter for removing out-of-band signals from the analog signal; and
    a power amplifier for amplifying the analog signal.

7. The transmitter module according to claim 6 wherein a separate DEM circuit is provided for each bit of the DAC.

8. The transmitter module according to claim 6 wherein the DAC is fabricated in silicon germanium (SiGe) heterojunction bipolar transistor (HBT) technologies.

9. The transmitter module according to claim 6 wherein the power amplifier is fabricated in silicon germanium (SiGe) heterojunction bipolar transistor (HBT) and gallium nitride (GaN) high electron mobility transistor (HEMT) technologies.

10. The transmitter module according to claim 6 wherein the cellular radio is a vehicle cellular radio.

11. An RF transmitter module for a cellular radio, said transmitter module comprising:
    a delta-sigma modulator including a plurality of interleaving dynamic element matching (DEM) circuits providing interleaved digital bits at a reduced clock rate;
    an interleaver controller for controlling the DEM circuits so as to provide groups of the digital bits at different points in time;
    a plurality of digital-to-analog converters (DACs) each receiving the group of the digital bits from a separate one of the DEM circuits, each DAC converting the group of interleaved digital bits to an analog signal;
    a summation junction adding the analog signal from each of the DACs to provide a combined analog signal;
    a tunable bandpass filter for removing out-of-band signals from the combined analog signal; and
    a power amplifier for amplifying the combined analog signal.

12. The transmitter module according to claim 11 wherein a separate DEM circuit is provided for each bit of the DAC.

13. The transmitter module according to claim 11 wherein the DACs are fabricated in silicon germanium (SiGe) heterojunction bipolar transistor (HBT) technologies.

14. The transmitter module according to claim 11 wherein the power amplifier is fabricated in silicon germanium (SiGe) heterojunction bipolar transistor (HBT) and gallium nitride (GaN) high electron mobility transistor (HEMT) technologies.

15. The transmitter module according to claim 11 wherein the cellular radio is a vehicle cellular radio.

16. An RF transmitter module for a cellular radio, said transmitter module comprising:
    a delta-sigma modulator including a plurality of interleaving dynamic element matching (DEM) circuits providing interleaved digital bits at a reduced clock rate;

an interleaver controller for controlling the DEM circuits so as to provide groups of the digital bits at different points in time;

a plurality of digital-to-analog converters (DACs) each receiving the group of the digital bits from a separate one of the DEM circuits, each DAC converting the group of interleaved digital bits to an analog signal;

at least one tunable bandpass filter for removing out-of-band signals from the analog signal;

a plurality of power amplifiers each receiving and amplifying the analog signal from a separate one of the DACs; and a summation junction adding the analog signals from each of the power amplifiers.

17. The transmitter module according to claim 16 wherein a separate DEM circuit is provided for each bit of the DAC.

18. The transmitter module according to claim 16 wherein the DACs are fabricated in silicon germanium (SiGe) heterojunction bipolar transistor (HBT) technologies.

19. The transmitter module according to claim 16 wherein the power amplifier is fabricated in silicon germanium (SiGe) heterojunction bipolar transistor (HBT) and gallium nitride (GaN) high electron mobility transistor (HEMT) technologies.

20. The transmitter module according to claim 16 wherein the cellular radio is a vehicle cellular radio.

* * * * *